(12) United States Patent
Batra et al.

(10) Patent No.: US 9,559,040 B2
(45) Date of Patent: *Jan. 31, 2017

(54) DOUBLE-SIDED SEGMENTED LINE ARCHITECTURE IN 3D INTEGRATION

(71) Applicant: International Business Machines Corporation, Armonk, NY (US)

(72) Inventors: Pooja R. Batra, White Plains, NY (US); John W. Golz, Manassas, VA (US); Mark Jacunski, Colchester, VT (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/143,015

(22) Filed: Dec. 30, 2013

(65) Prior Publication Data

US 2015/0187642 A1 Jul. 2, 2015

(51) Int. Cl.
| | |
|---|---|
| *H01L 21/44* | (2006.01) |
| *H01L 23/48* | (2006.01) |
| *H01L 21/768* | (2006.01) |
| *H01L 23/00* | (2006.01) |
| *H01L 25/00* | (2006.01) |

(Continued)

(52) U.S. Cl.
CPC ....... *H01L 23/481* (2013.01); *H01L 21/76877* (2013.01); *H01L 23/528* (2013.01); *H01L 23/5226* (2013.01); *H01L 24/24* (2013.01); *H01L 24/80* (2013.01); *H01L 24/92* (2013.01); *H01L 24/94* (2013.01); *H01L 25/0657* (2013.01); *H01L 25/50* (2013.01); *H01L 24/82* (2013.01); *H01L 25/18* (2013.01); *H01L 2224/08145* (2013.01); *H01L 2224/24145* (2013.01); *H01L 2224/80895* (2013.01); *H01L 2224/80896* (2013.01); *H01L 2224/9202* (2013.01); *H01L 2224/94* (2013.01); *H01L 2225/06524* (2013.01); *H01L 2225/06541* (2013.01); *H01L 2225/06544* (2013.01); *H01L 2225/06558* (2013.01); *H01L 2924/14* (2013.01); *H01L 2924/1431* (2013.01); *H01L 2924/1434* (2013.01)

(58) Field of Classification Search
CPC ............... H01L 23/481; H01L 2924/00; H01L 21/76877; H01L 2924/0002; H01L 2021/60022
USPC ............... 257/691, 499; 365/196, 63, 185.11
See application file for complete search history.

(56) References Cited

U.S. PATENT DOCUMENTS 6,466,478 B1 * 10/2002 Park .................. 365/185.11
8,344,496 B1 * 1/2013 White et al. ................ 257/691
(Continued)

*Primary Examiner* — Tuan Nguyen
(74) *Attorney, Agent, or Firm* — L. Jeffrey Kelly

(57) ABSTRACT

Embodiments of the present invention relate generally to electronic components such as semiconductor wafers and more particularly, to a double-sided three-dimensional (3D) hierarchal architecture scheme for multiple semiconductor wafers using an arrangement of through silicon vias (TSVs) and backside wiring. In an embodiment a first word line architecture may be formed on a front side of an IC chip and connected to a second word line architecture formed on a back side of the IC chip through intra-wafer, TSVs, thereby relocating required wiring to the back side of the IC chip.

10 Claims, 16 Drawing Sheets

(51) Int. Cl.
*H01L 23/522* (2006.01)
*H01L 23/528* (2006.01)
*H01L 25/065* (2006.01)
*H01L 25/18* (2006.01)

(56) References Cited

U.S. PATENT DOCUMENTS

| | | | | |
|---|---|---|---|---|
| 8,561,004 B2* | 10/2013 | Kosonocky | ......... | H01L 23/5286 438/129 |
| 8,563,403 B1* | 10/2013 | Farooq | ................ | H01L 21/8221 257/E21.597 |
| 8,674,470 B1* | 3/2014 | Or-Bach | .................. | H01L 25/50 257/499 |
| 2003/0156466 A1* | 8/2003 | Schreck | ................... | G11C 7/06 365/196 |
| 2011/0292708 A1* | 12/2011 | Kang | ...................... | H01L 24/17 365/63 |
| 2013/0105941 A1* | 5/2013 | Vanslette | .............. | H01L 23/481 257/531 |

* cited by examiner

DOUBLE-SIDED SEGMENTED LINE ARCHITECTURE IN 3D INTEGRATION

BACKGROUND

The present invention relates generally to electronic components such as semiconductor wafers and more particularly, to a hierarchical architecture in a 3D integration scheme for multiple integrated circuit (IC) chips in which a global circuit and a local circuit on a front side of the IC chip is coupled to a global signal line on a back side of the IC chip with an arrangement of inter-wafer and intra-wafer through silicon vias (TSVs).

As packaging density in semiconductor devices continues to increase in order to accommodate more devices into a package, three-dimensional (3D) chip stacking technology has become more widely used in the industry. Typically, a semiconductor wafer includes several layers of integrated circuitry (IC) (e.g., processors, programmable devices, memory devices, etc.) built on a silicon substrate. A top layer of the chip may be connected to a bottom layer of the wafer by through-silicon vias (TSVs) or interconnects. In order to form a 3D chip stack, two or more wafers are placed on top of one another and bonded.

3D chip stacking technology offers a number of potential benefits, including, for example, improved form factors, lower costs, enhanced performance, and greater integration through system-on-chip (SOC) solutions. In addition, the 3D chip stacking technology may provide other functionality to the chip. SOC architectures formed by 3D chip stacking can enable high bandwidth connectivity of products such as, for example, logic circuitry and dynamic random access memory (DRAM), that otherwise have incompatible process flows. At present, there are many applications for 3D chip stacking technology, including high performance processing devices, video and graphics processors, high density and high bandwidth memory chips, and other SOC solutions.

SUMMARY

According to one embodiment of the present invention, a method is disclosed. The method may include: forming one or more intra-wafer through substrate vias (TSVs) extending from a front side of an integrated circuit (IC) chip to a back side of the IC chip; forming a local architecture in a front side wiring layer of the IC chip, the local architecture having one or more local features electrically connected to the one or more intra-wafer TSVs; and forming a global architecture in a back side wiring layer of the IC chip, the global architecture connecting to the one or more intra-wafer TSVs and electrically coupling the one or more local features together.

According to another embodiment of the present invention, a method is disclosed. The method may include: forming one or more intra-wafer through substrate vias (TSVs) extending from a front side of an integrated circuit (IC) chip to a back side of the IC chip; forming a local architecture in a front side wiring layer of the IC chip, the local architecture having one or more local features electrically connected to the one or more intra-wafer TSVs; forming a global architecture in a back side wiring layer of the IC chip, the global architecture connecting to the one or more intra-wafer TSVs and electrically coupling the one or more local features together; and forming one or more inter-wafer TSVs extending through an entire thickness of a periphery of the IC chip, the inter-wafer TSVs having a width that is approximately 1.25 times to approximately 30 times larger than a width of the one or more intra-wafer TSVs.

According to another embodiment of the present invention, a structure is disclosed. The structure may include: one or more intra-wafer through substrate vias (TSVs) extending from a front side of an integrated circuit (IC) chip to a back side of the IC chip; a local architecture in a front side wiring layer of the IC chip, the local architecture having one or more local features electrically connected to the one or more intra-wafer TSVs; and a global architecture in a back side wiring layer of the IC chip, the global architecture connecting to the one or more intra-wafer TSVs and electrically coupling the one or more local features together.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
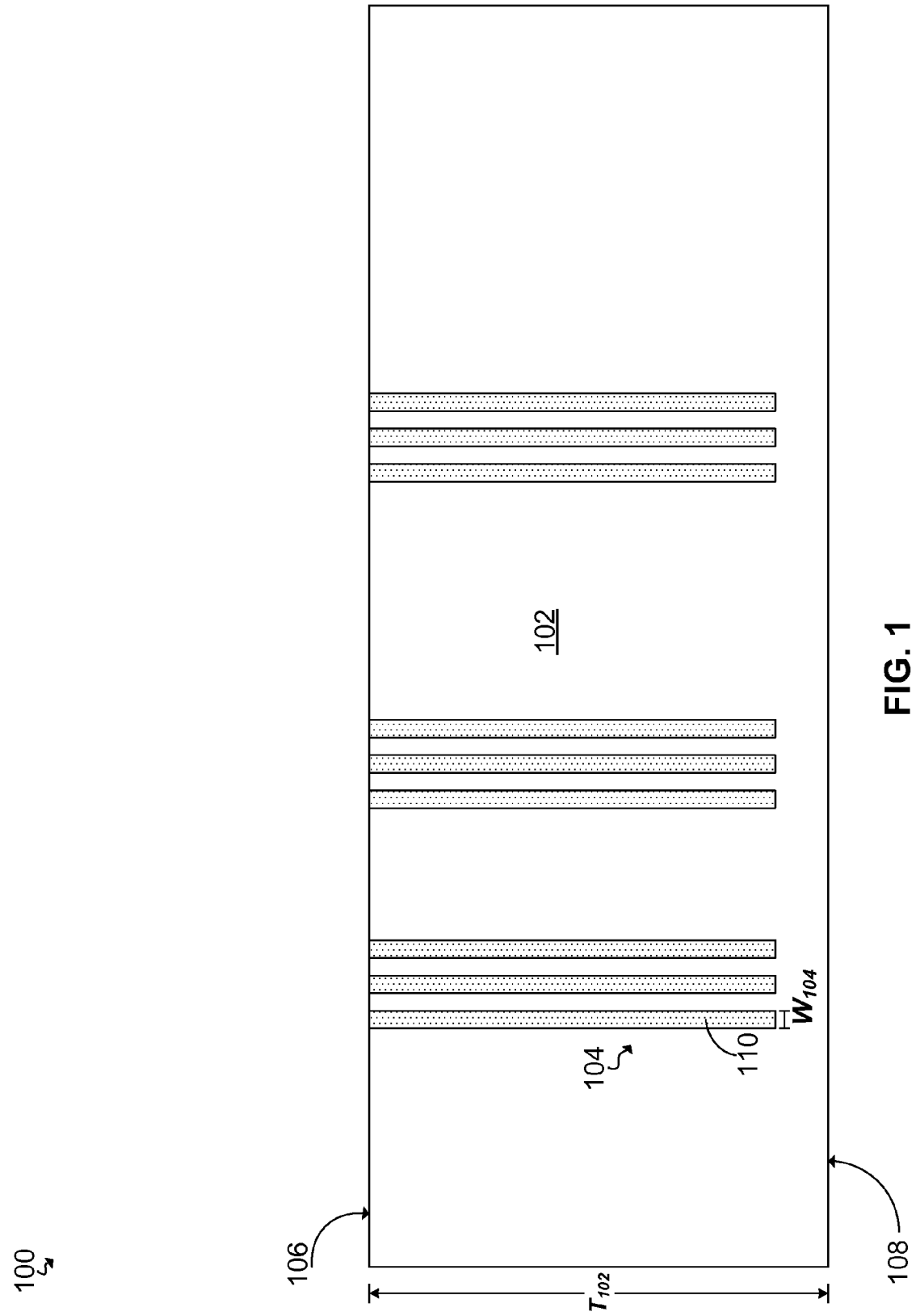
FIG. 1 is a cross-sectional view illustrating forming multiple intra-wafer TSVs in a semiconductor substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to electronic components such as semiconductor wafers, and more particularly, to a segmented 3D routing architecture scheme for power, wordline, dataline, and logic signals in multiple semiconductor wafers using an arrangement of through silicon vias (TSVs) and back side wiring. One way to implement the segmented 3D routing scheme may include routing signals from a device on a front side of an IC chip to a thicker back side wiring through intra-wafer TSVs and then routing the signals back to other devices on the front side through the intra-wafer TSVs. The implementation may further include large inter-wafer TSVs for chip to chip communication and/or external power supply coupled to a switch connected to the backside wiring layers or directly to the back side wiring layers. The back side wiring may then be connected to circuits on the front side through the intra-wafer TSVs. This arrangement may allow for power to be supplied to specific circuits on the front side only if necessary (i.e., a power-gating approach). This power-gating approach may allow for a defective circuit to be isolated from the power supply, which may improve 3D chip yield. In addition, the ability to selectively turn the switch on and off, stand-by current due to the device leakage can also be reduced. An embodiment by which to implement the segmented 3D routing scheme using intra-wafer TSV and inter-wafer TSV for hierarchical decoding architecture is described in detail below by referring to the accompanying drawings FIGS. 1-16.

It should be appreciated that although specific wafer substrate bonding process flows are depicted herein, such descriptions are exemplary only, and that the principles disclosed herein are also applicable to various types of TSV conductive materials, dielectric, and adhesive interface materials, and multiple types of semiconductor wafers and substrates. As such, the acronym "TSV" may also be used to more generally refer to "through substrate via" in addition to the conventional "through silicon via" meaning. Moreover, such bonding may include arrangements such as face-to-face, face-to-back, and face-to-face-to-back bonding, and such bonded structures may also incorporate microelectromechanical system (MEMS) structures as well.

Referring now to FIG. 1, a cross-sectional view of a structure 100 is shown. FIG. 1 illustrates forming multiple intra-wafer TSVs 104 in a semiconductor substrate 102 using known techniques. In one embodiment, the semiconductor substrate 102 can be composed of a bulk semiconductor substrate made from any of several known semiconductor materials such as, for example, Si, strained Si, Ge, SiGe, Si:C, SiGeC, Si alloys, Ge alloys, and compound (e.g. III-V and II-VI) semiconductor materials. Non-limiting examples of compound semiconductor materials include GaAs, InAs, and InP, or any combination thereof. The semiconductor substrate 102 can be approximately, but is not limited to, several hundred microns thick. For example, the semiconductor substrate 102 thickness $T_{102}$ may range from approximately 10 μm to approximately 1000 μm, although the thickness range can change depending on the applications involved.

Although not depicted in FIG. 1, the semiconductor substrate 102 can also be composed of a semiconductor on insulator (SOI) substrate. SOI substrates are typically composed of at least an SOI layer overlying a dielectric layer, often referred to as a buried dielectric layer. A base semiconductor layer can be present below the dielectric layer. The SOI layer and the base semiconductor layer can be composed of similar materials as the bulk semiconductor substrate described above. The buried dielectric layer can be formed by implanting a high-energy dopant into a bulk semiconductor substrate, and then annealing the structure to form a buried oxide layer. In another embodiment, the buried dielectric layer can be deposited or grown prior to the formation of the SOI layer. In yet another embodiment, the SOI substrate can be formed using wafer-bonding techniques, where a bonded wafer pair is formed using glue, an adhesive polymer, or direct bonding. The buried dielectric layer can have a thickness ranging from approximately 100 nm to approximately 500 nm thick. The SOI layer can have a thickness similar to the buried dielectric layer and the base semiconductor layer can have a thickness ranging from approximately 10 µm to approximately 1000 µm, although the working thickness range may vary depending on the applications.

The intra-wafer TSVs 104 may be formed by any known patterning and etching process suitable to form TSVs. In one embodiment, the intra-wafer TSVs 104 may be formed by forming a photoresist layer (not shown) over a front side 106 of the semiconductor substrate 102 and above any FEOL structures (not shown) present thereon. The photoresist layer may then be patterned using a photolithography process to expose portions of the semiconductor substrate 102. The exposed portions of the semiconductor substrate 102 may then be etched, preferably using a dry etching process such as reactive ion etching (RIE) to form TSV trenches (not shown). An insulating liner (not shown) may then be formed within the TSV trenches (not shown).

Next, the TSV trenches (not shown) may be filled with a conductive material 110 using any known technique, such as, for example, depositing or electroplating. In an embodiment, a seed layer (not shown) may be deposited within the TSV trenches (not shown), and on top of the insulating liner (not shown) to facilitate electroplating the conductive material 110. A planarization process, such as chemical mechanical planarization (CMP), may then be performed to remove any excess material.

The conductive material 110 may include, but is not limited to, copper (Cu), tungsten (W), alloys thereof, or other metallic materials of sufficiently low resistivity. The insulating liner (not shown) may be silicon oxide or silicon nitride or other insulator material. The seed layer (not shown) may be formed on the insulating liner (not shown) and may act as an adhesive and diffusion barrier for the conductive material 110. The seed layer (not shown) may be composed of one or more layers of a metal nitride, such as, for example titanium nitride (TiN), tantalum nitride (TaN) or other such suitable material.

It should be noted that the intra-wafer TSVs 104 may not extend through the entire thickness $T_{102}$ of the semiconductor substrate 102. A bottom of the intra-wafer TSVs 104 may be exposed after a back side 108 of the semiconductor substrate 102 is thinned or recessed in a subsequent process step described below with reference to FIG. 5. In one embodiment, each of the intra-wafer TSVs 104 may have a width $W_{104}$ ranging from approximately 0.05 µm to approximately 0.5 µm. In another embodiment, each of the intra-wafer TSVs 104 may have a width $W_{104}$ ranging from approximately 0.1 µm to approximately 0.4 µm. In one embodiment, the intra-wafer TSVs 104 may have a width to height ratio of approximately 1:40, and as such may be referred to as high-aspect ratio TSVs. It should be noted that the fabrication techniques described above with respect to the intra-wafer TSVs 104 may be specifically chosen for their suitability in fabricating high-aspect ratio TSVs.

It should also be noted that the intra-wafer TSVs 104 may be formed in the semiconductor substrate 102 at multiple points during fabrication. In an embodiment, the intra-wafer TSVs 104 may be formed after the front end of the line (FEOL) structures (not shown) have been formed in an epitaxial layer (not shown) overlying a front side 106 of the semiconductor substrate 102. The intra-wafer TSVs 104 may be formed by patterning over and etching through the epitaxial layer (not shown) preferably during FEOL/middle of the line (MOL) processing or, at the latest, during formation of a $M_x$ layer.

In another embodiment, the intra-wafer TSVs 104 may be formed later in the process, after the formation of the FEOL structures and front side wiring levels (FIG. 2), and after a back side 108 of the semiconductor substrate 102 is thinned using known techniques. The intra-wafer TSVs 104 may thereby be formed by etching through an entire thickness of the thinned semiconductor substrate 102 from the back side 108 to form backside trenches (not shown). In this embodiment, a "bottom" of the backside trenches (not shown) may be in contact with a landing pad (not shown) formed on the front side 106 of the semiconductor substrate 102 during earlier FEOL processing. The landing pad (not shown) may be composed of a conductive material having a different etch rate than the semiconductor substrate 102, and may serve as an etch stop during the formation of the backside trenches (not shown). Intra-wafer TSVs 104 may then be formed by filling the backside trenches (not shown) with a conductive material using substantially similar techniques as those described above. In an embodiment, an anisotropic etch, such as, for example, RIE, may be performed to remove only a bottom portion of an insulating liner (not shown) from the bottom of the backside trenches (not shown). The bottom portion of the insulating liner is removed to ensure electrical connectivity through the entire length of the intra-wafer TSVs 104, and specifically between the conductive material of the TSV and the corresponding landing pad.

Figure 2:
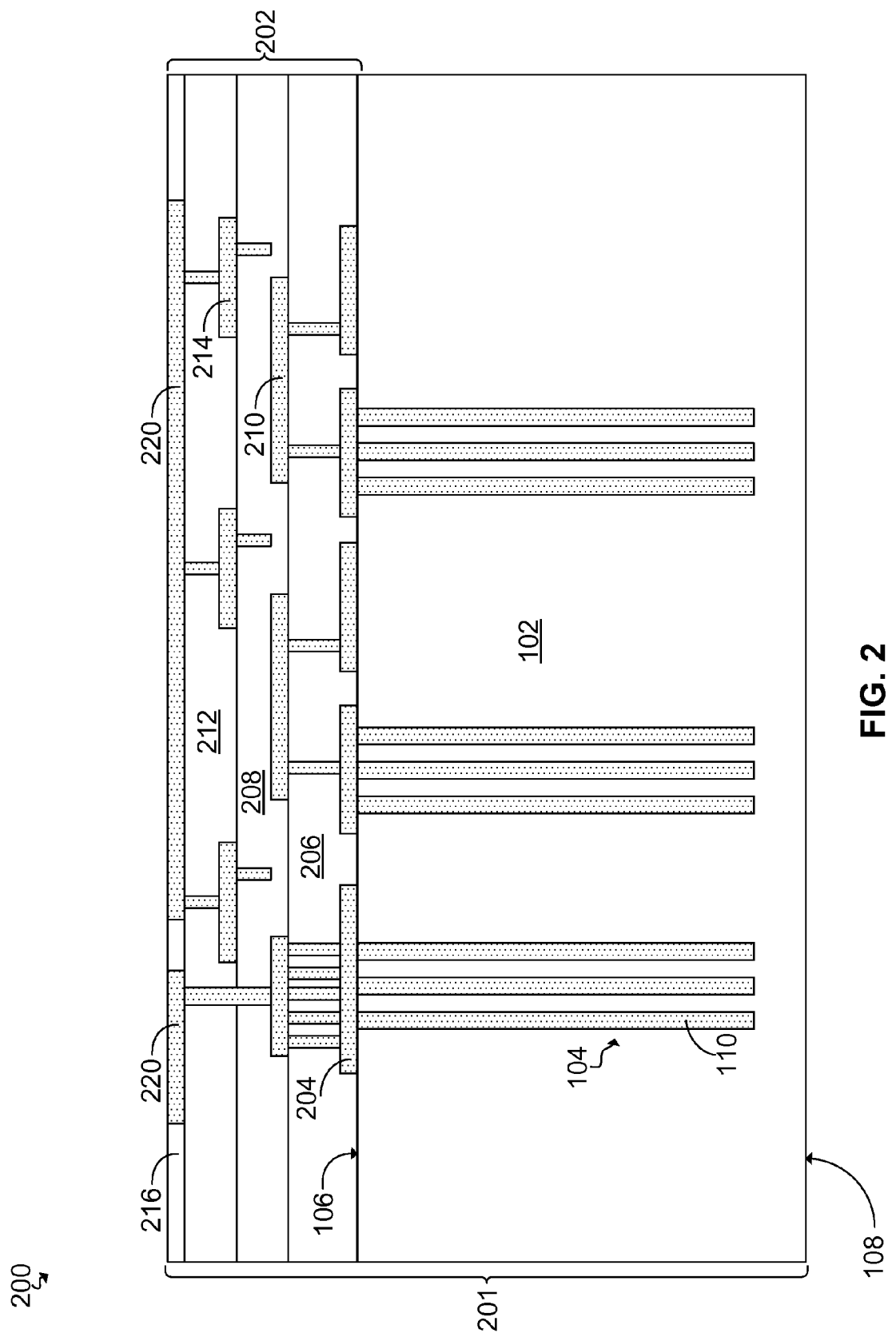
FIG. 2 is a cross-sectional view illustrating forming wiring layers on a front side of the semiconductor substrate, according to an embodiment of the present invention.

Referring now to FIG. 2, a cross-sectional view of a structure 200 is shown. FIG. 2 illustrates forming one or more wiring layers 202 above one or more transistors or FEOL structures (not shown) on the structure 100 to form a first integrated circuit (IC) chip 201 (hereinafter "first IC chip"). In one embodiment, the first IC chip 201 may represent a memory chip having FEOL, MOL, and back end of the line (BEOL) structures formed thereon, as known in the art. However, it should be noted that the first IC chip 201 could be a processor chip or a wafer with any type of IC devices present on it, including wafer multi-stacks. The methods presented herein can therefore be used for homogeneous wafer bonding/stacking (i.e., memory to memory, logic to logic, etc.) or heterogeneous wafer bonding/stacking (i.e., memory to logic, etc.).

It will be appreciated that the wiring layers 202 are illustrative only. In an actual device, there may be several layers of insulator materials and associated wiring formed therein. In an embodiment, the wiring layers 202 may include the $M_x$ layer 206 having $M_x$ wiring 204, a $M_{x+1}$ layer 208 having $M_{x+1}$ wiring 210, a $M_{x+2}$ layer 212 having $M_{x+2}$ wiring 214, and a $M_{x+3}$ layer 216 having $M_{x+3}$ wiring 220. The $M_x$ layer 206, the $M_{x+1}$ layer 208, the $M_{x+2}$ layer 212, and the $M_{x+3}$ layer 216 may be composed of an insulator, such as a dielectric. The dielectric may include any suitable dielectric material, for example, silicon oxide, silicon nitride, hydrogenated silicon carbon oxide, silicon based low-k dielectrics, porous dielectrics, or organic dielectrics including porous organic dielectrics. The $M_x$ layer 206, the $M_{x+1}$ layer 208, the $M_{x+2}$ layer 212, and the $M_{x+3}$ layer 216 may be formed using known suitable deposition techniques, such as, for example, atomic layer deposition (ALD), chemical vapor deposition (CVD), plasma enhanced chemical vapor deposition (PECVD), spin on deposition, or physical vapor deposition (PVD). The $M_x$ layer 206, the $M_{x+1}$ layer 208, the $M_{x+2}$ layer 212, and the $M_{x+3}$ layer 216 may each have a thickness ranging from approximately 70 nm to approximately 140 nm, although greater and lesser thicknesses are explicitly contemplated.

The $M_x$ wiring 204, the $M_{x+1}$ wiring 210, the $M_{x+2}$ wiring 214, and the $M_{x+3}$ wiring 220 may be, for example, typical lines, vias, or wires found in a typical wiring structure. The $M_x$ wiring 204, the $M_{x+1}$ wiring 210, the $M_{x+2}$ wiring 214, and the $M_{x+3}$ wiring 220 may be made of a conductive interconnect material including, for example, copper, aluminum, or tungsten. The conductive interconnect material may be formed using a conventional patterning/etching technique such as, photolithography and RIE, and a conventional filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various liners (not shown) may be formed in the $M_x$ wiring 204, the $M_{x+1}$ wiring 210, the $M_{x+2}$ wiring 214, and the $M_{x+3}$ wiring 220. In one embodiment, a liner may include, for example, a tantalum nitride layer, followed by a tantalum layer. Other barrier liners may include manganese, cobalt or ruthenium, either alone or in combination with any other suitable liner.

In an embodiment, the $M_x$ wiring 204, the $M_{x+1}$ wiring 210, the $M_{x+2}$ wiring 214, and the $M_{x+3}$ wiring 220 may have a width that is substantially similar to the width of the intra-wafer TSVs 104. This may allow for a connection of the intra-wafer TSVs 104 directly to the FEOL structures (not shown) and the wiring layers 202 without significant modification, thereby minimizing any area penalty from the intra-wafer TSVs 104 on the front side 106 of the first IC chip 201.

Figure 3:
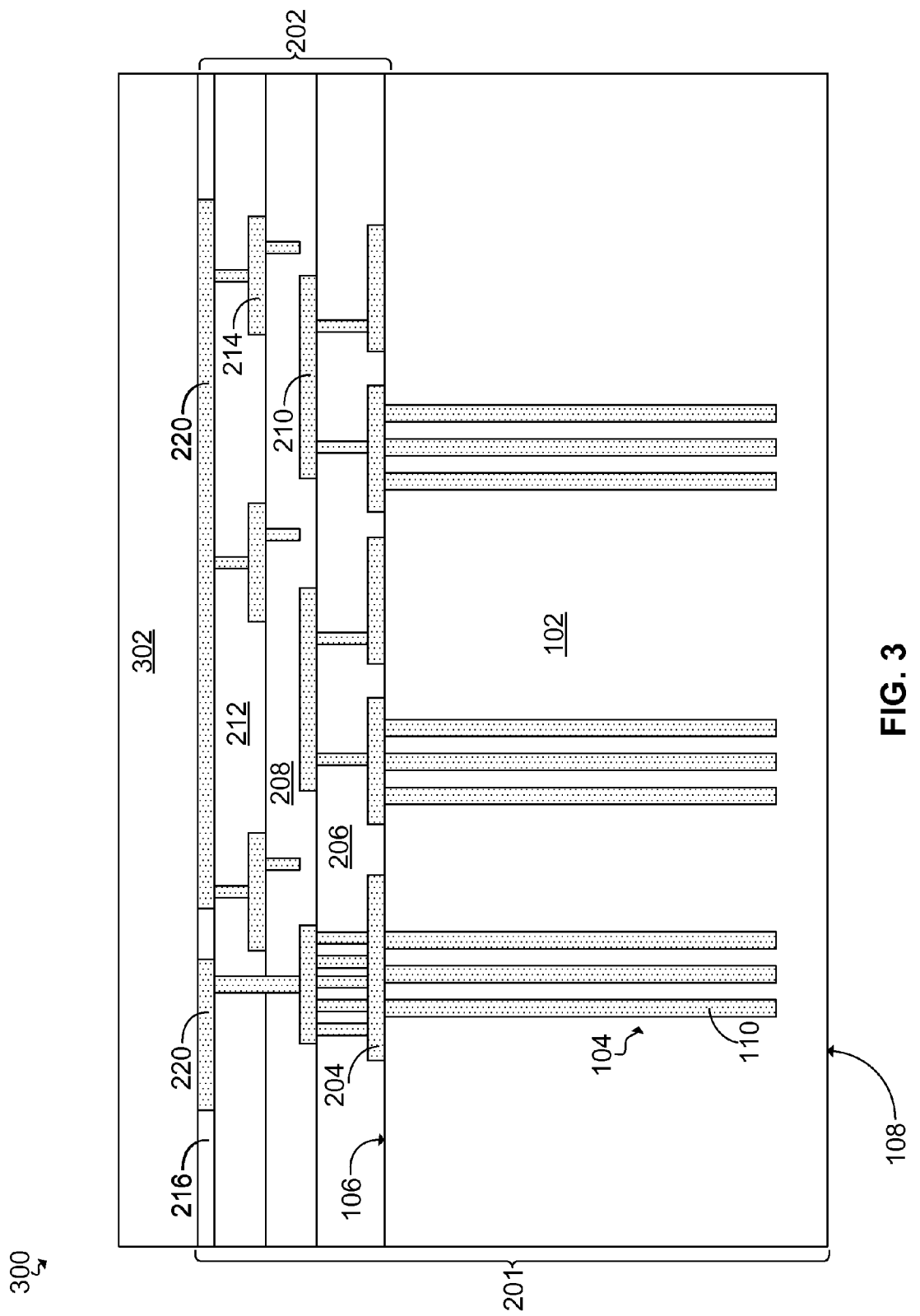
FIG. 3 is a cross-sectional view illustrating forming a first passivation layer on the structure shown in FIG. 2, according to an embodiment of the present invention.

Referring now to FIG. 3, a cross-sectional view of a structure 300 is shown. FIG. 3 illustrates forming a first bonding layer 302 on the first IC chip 201 in preparation of chip bonding. The first bonding layer 302 may be composed of an oxide, or other suitable type of insulator material (including any permanent adhesive material). In an embodiment, the first bonding layer 302 may also include metal regions (not shown) defined therein to serve as electric contacts to a second IC chip. The first bonding layer 302 may be formed using known suitable deposition techniques, such as, for example, ALD, CVD, PECVD, spin on deposition, or PVD. It should be noted that although the first bonding layer 302 is illustrated as one layer, it is contemplated that the first bonding layer 302 may be composed of multiple layers.

Figure 4:
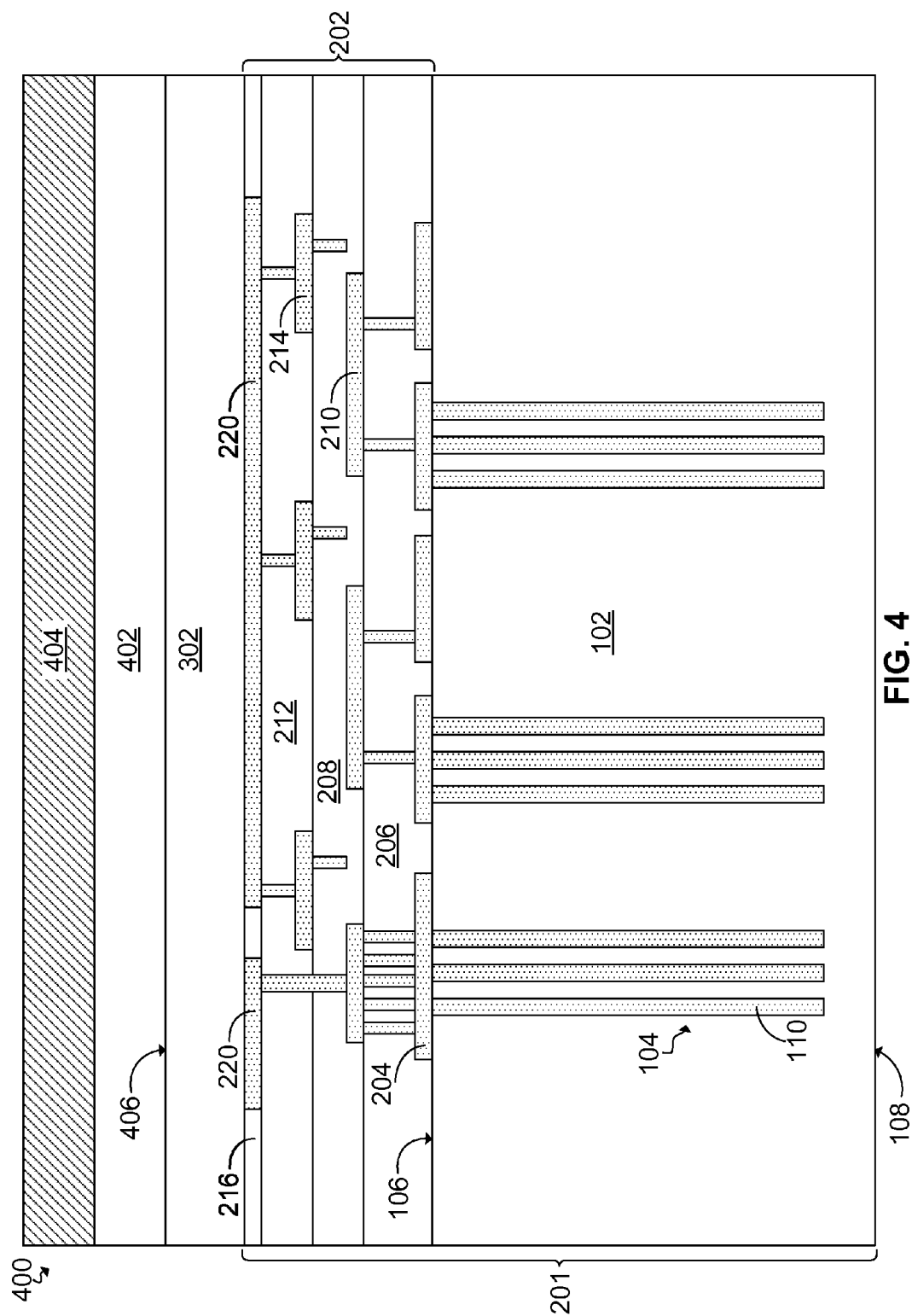
FIG. 4 is a cross-sectional view illustrating bonding the structure shown in FIG. 3 to a second wafer, according to an embodiment of the present invention.

Referring now to FIG. 4, a cross-sectional view of a structure 400 is shown. FIG. 4 illustrates joining the first IC chip 201 to a second IC chip 404 by bonding the first bonding layer 302 on the first IC chip 201 to a second bonding layer 402 on a second IC chip 404. The second bonding layer 402 may be substantially similar to the first bonding layer 302 and formed using substantially similar techniques as those described above in reference to FIG. 3. In an embodiment in which an oxide is used to form the first bonding layer 302 and the second bonding layer 402, oxide-to-oxide bonding (e.g., surface activation, cleaning, initial bonding, and annealing) may be used to bond the first bonding layer 302 and the second bonding layer 402 together. In addition, permanent adhesive bonding, or any other suitable technique in the art that results in a strong bond between electrically insulating layers may be used. Other exemplary techniques may include metal-to-metal thermal compression bonding, or other known hybrid bonding techniques. A bonding interface 406 may be formed between the first bonding layer 302 and the second bonding layer 402. The bonding interface 406 may be composed entirely of insulating materials, or of insulating materials having a conductive regions (not shown) therein.

It should be noted that the second IC chip 404 may be a memory chip, or a processor chip, having FEOL, MOL, and BEOL structures (not shown) formed thereon, as known in the art. More generally, the second chip 404 may be a wafer with any type of IC devices present on it. Even more generally, the first IC chip 201 and the second IC chip 404 may both represent any type of IC devices formed on a substrate where it is desired to integrate the same or other types of integrated circuit devices in a 3D fashion.

Figure 5:
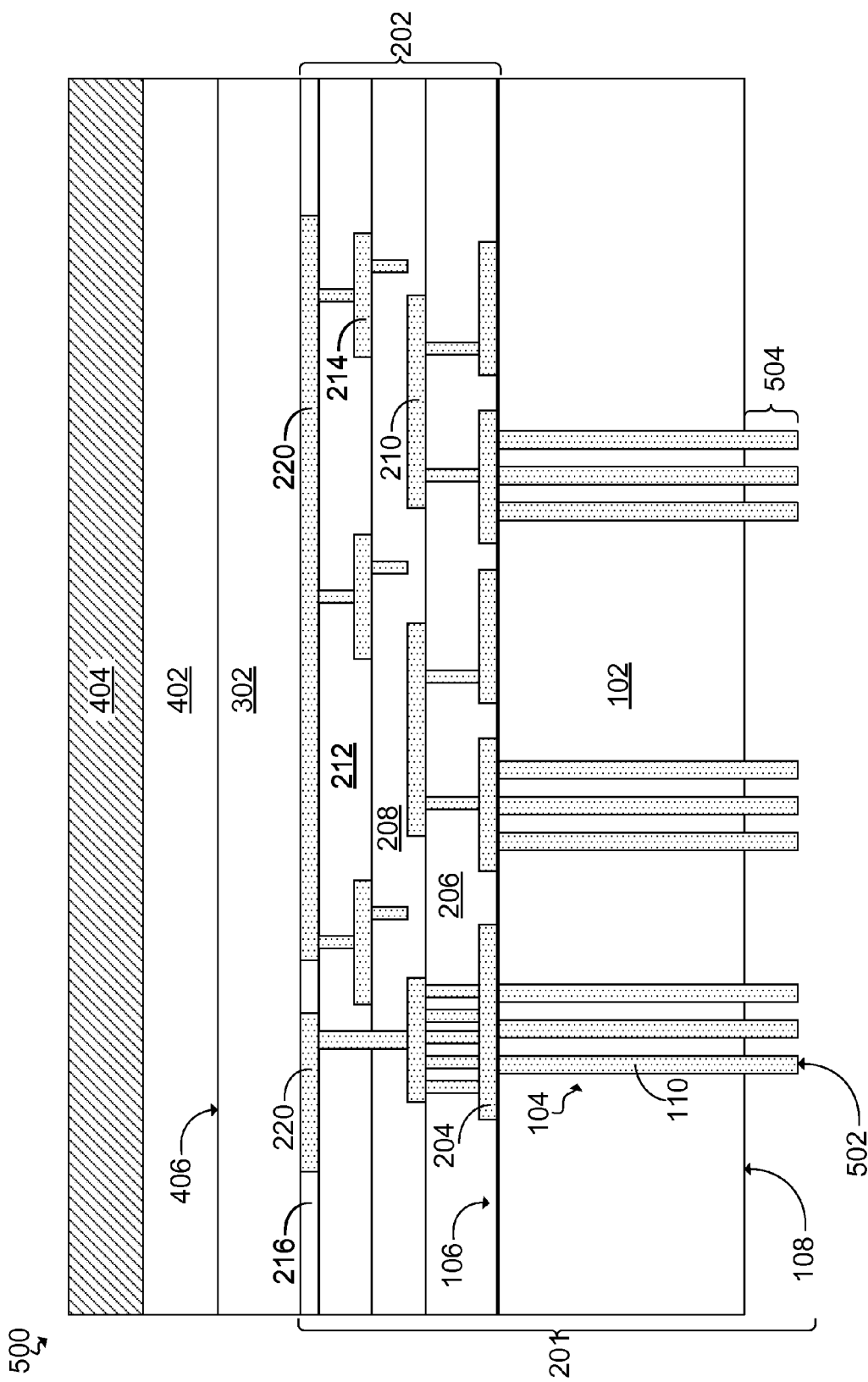
FIG. 5 is a cross-sectional view illustrating removing a portion of the backside of the semiconductor substrate, according to an embodiment of the present invention.

Referring now to FIG. 5, a cross-sectional view of a structure 500 is shown. FIG. 5 illustrates the structure 400 (FIG. 4) after a portion of the back side 108 of the semiconductor substrate 102 is recessed to expose the intra-wafer TSVs 104. In an embodiment, the portion of the back side 108 may be recessed using any known technique, including, for example, hydrofluoric/nitric/acetic (HNA) acid etching, reactive ion etching (RIE), or combinations thereof. In such cases, as illustrated in the figure, the recess technique may remove only portions of the substrate 102 selective to the intra-wafer TSVs 104, resulting in portions of the intra-wafer TSVs 504 remaining above the back side 108. In an embodiment in which the intra-wafer TSVs 104 include an insulating liner (not shown), an etching process, such as RIE, may be used to remove portions of the insulating liner (not shown) so that a bottom TSV surface 502, composed of the conductive material 110, is exposed. This allows for a conductive path through the entire thickness of the semiconductor substrate 102.

In another embodiment, the portion of the back side 108 may be recessed using a substantially non-selective technique, including, for example, grinding, chemical mechanical planarization (CMP), or combinations thereof. In such cases, the recess technique may also remove portions of the intra-wafer TSVs 104 so that a bottom TSV surface 502 is exposed. In this embodiment, the bottom surface 502 may be substantially coplanar with the back side 108 of the semiconductor substrate 102.

Figure 6:
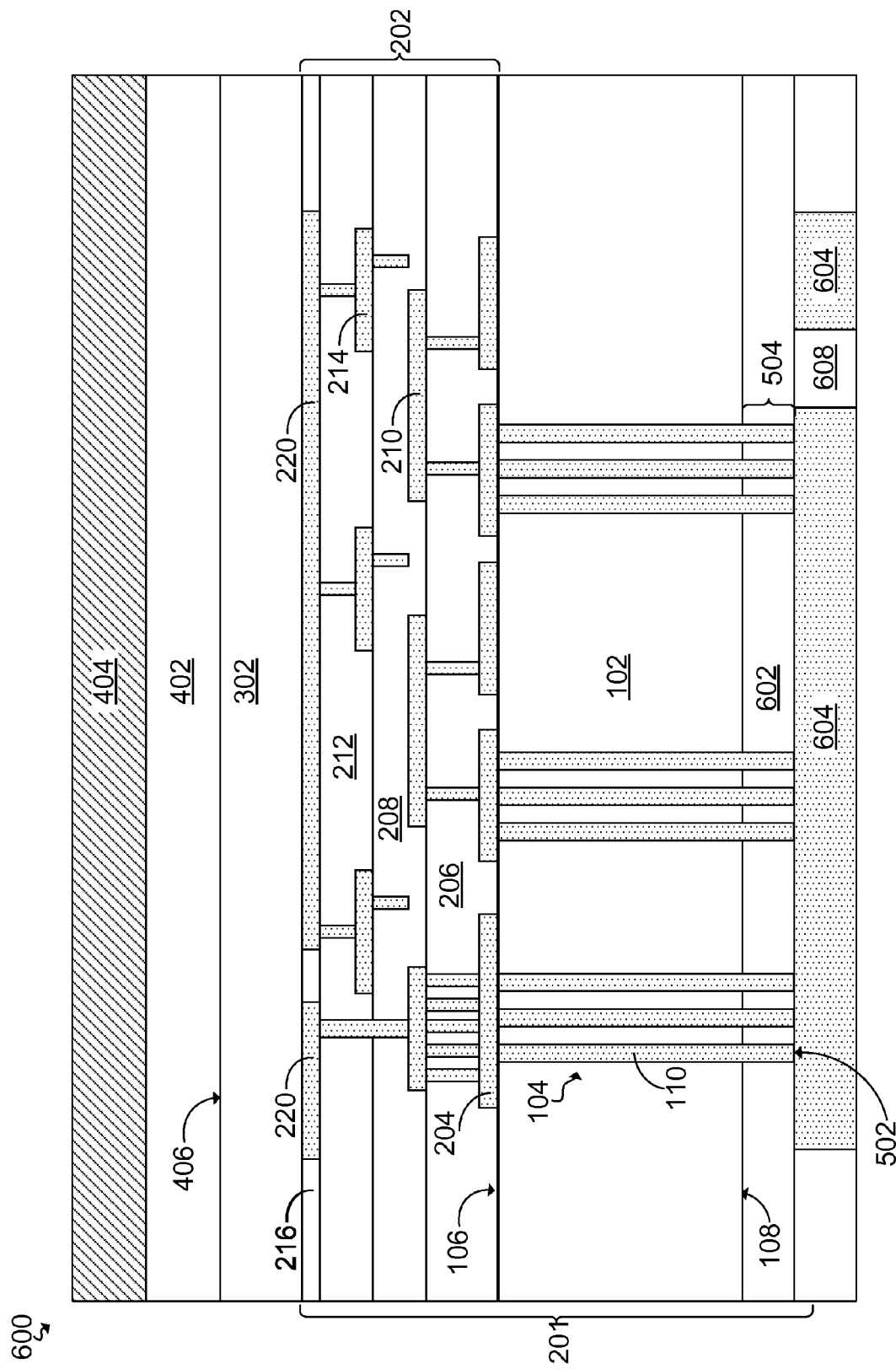
FIG. 6 is a cross-sectional view illustrating forming a backside dielectric layer and backside wiring on the backside of the semiconductor wafer, according to an embodiment of the present invention.

Referring now to FIG. 6, a cross-sectional view of a structure 600 is shown. FIG. 6 illustrates forming a back side dielectric layer 602 and back side wiring 604 on the structure 500. The a back side dielectric layer 602 may be formed on the back side 108 of the semiconductor wafer 102. The back side dielectric layer 602 may be substantially similar to the $M_x$ layer 206, the $M_{x+1}$ layer 208, the $M_{x+2}$ layer 212, and the $M_{x+3}$ layer 216 and may be formed using substantially similar techniques as those described above with reference to FIG. 2. In an embodiment in which the bottom TSV surface 502 extends beyond the back side 108, the back side dielectric layer 602 may be formed by depositing a dielectric material (not shown) using any known blanket deposition process. The dielectric material (not shown) may then be planarized using any known planarization process so that the bottom TSV surface 502 is substantially flush with an upper surface of the back side dielectric layer 602.

In an embodiment in which the bottom TSV surface 502 is substantially flush with the back side 108, back side contacts (not shown) may be formed through an entire thickness of the back side dielectric layer 602 after it is formed to connect to the intra-wafer TSVs 104. The back side contacts (not shown) may be substantially similar to the intra-wafer TSVs 104 and may be formed using substantially similar techniques as those described above with reference to FIG. 1.

In an embodiment, a back side wiring dielectric layer 608 may be formed over the back side dielectric layer 602. The back side wiring dielectric layer 608 may be substantially similar to the backside dielectric layer 602 and may be formed using substantially similar techniques. The back side wiring 604 may then be formed in the back side wiring dielectric layer 608. The back side wiring 604 may be electrically connected to the intra-wafer TSVs 104, which may then be connected to the FEOL structures (not shown), and the front side wiring layers 202. In an embodiment in which back side contacts (not shown) are formed in the back side dielectric layer 602, the back side wiring 604 may be electrically connected to the back side contacts (not shown), which, in turn, connect to the intra-wafer TSVs 104.

The back side wiring 604 wiring may be substantially similar to the $M_x$ wiring 204, the $M_{x+1}$ wiring 210, the $M_{x+2}$ wiring 214, and the $M_{x+3}$ wiring 220 and may be formed using substantially similar techniques as those described above with reference to FIG. 2. However, the back side wiring 604 may be substantially thicker than the $M_x$ wiring 204, the $M_{x+1}$ wiring 210, the $M_{x+2}$ wiring 214, and the $M_{x+3}$ wiring 220. In one embodiment, the back side wiring 604 may have a thickness that is approximately 8 times to approximately 10 times than the thickness of the $M_x$ wiring 204, the $M_{x+1}$ wiring 210, the $M_{x+2}$ wiring 214, and the $M_{x+3}$ wiring 220. In an embodiment, the back side wiring 604 may be used as a communication pathway between global and local circuits arranged in a front side 106 using the intra-wafer TSVs 104, the details of which is discussed in detail below with reference to FIGS. 8-16.

Figure 7:
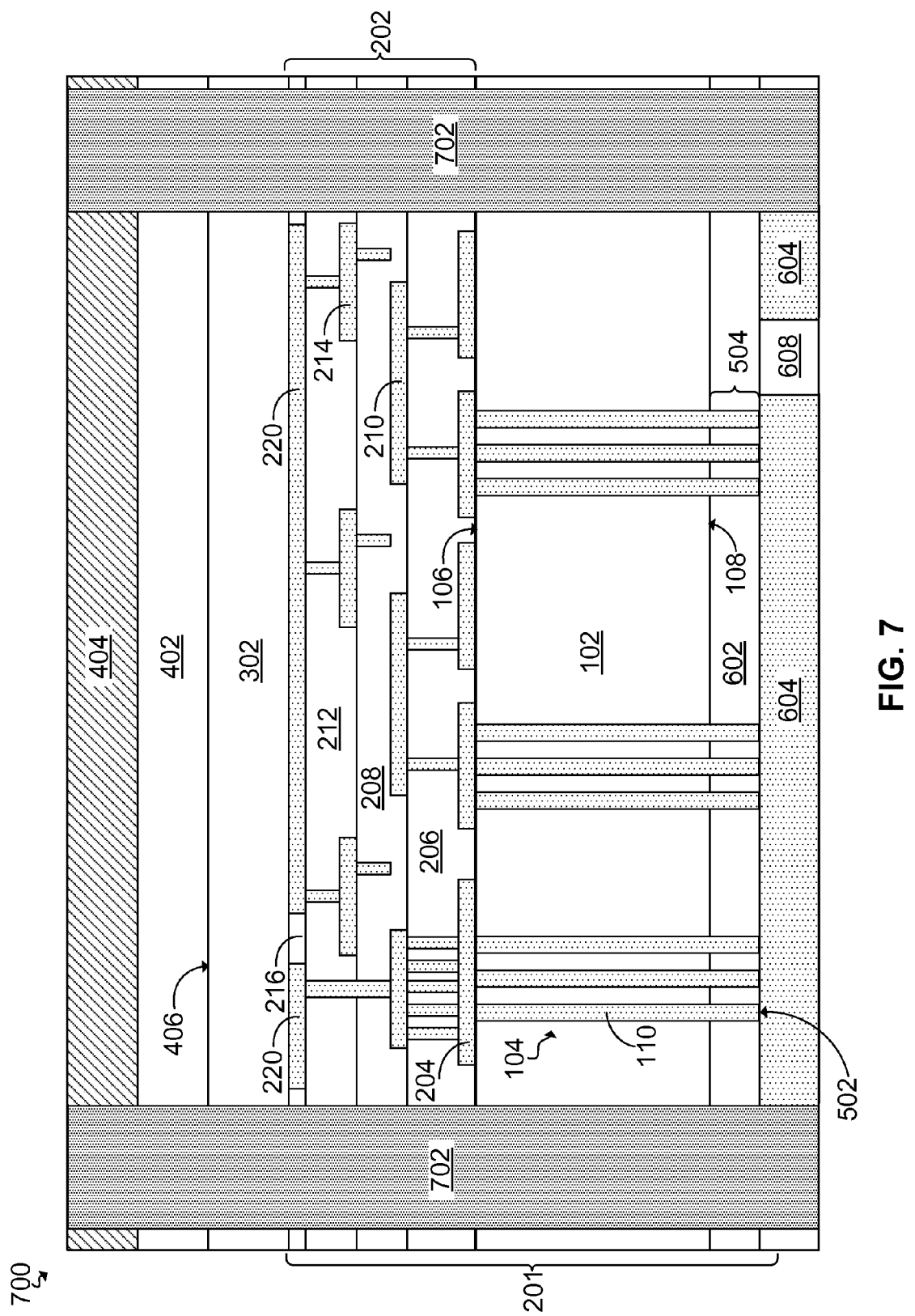
FIG. 7 is a cross-sectional view illustrating forming inter-wafer TSVs through an entire thickness of the first wafer and the second wafer, according to an embodiment of the present invention.

Referring now to FIG. 7, a cross-sectional view of a structure 700 is shown. The structure 700 illustrates a stack of IC chips, and may be referred to as a 3D integrated structure. FIG. 7 illustrates forming inter-wafer TSVs 702 through an entire thickness of the structure 600 (FIG. 6). The inter-wafer TSVs 702 may be substantially similar to the intra-wafer TSVs 104 and may be formed using substantially similar techniques as those described above with reference to FIG. 1. However, the inter-wafer TSVs 702 may be larger than the intra-wafer TSVs 104. In one embodiment, the inter-wafer TSVs 702 may have a width $W_{702}$ ranging from approximately 0.5 µm to approximately 3 µm. In addition, because the inter-wafer TSVs 702 pass through multiple wafers, each potentially having multiple layers of different compositions, a multi-step etching process may be used. In an embodiment, the inter-wafer TSVs 702 may be formed at or near the periphery of the structure 700, and more specifically, at or near the periphery of the first IC chip 201 and the second IC chip 404.

Generally, the inter-wafer TSVs 702 may electrically connect some or all of the stacked wafers in the 3D integrated structure. More specifically, the inter-wafer TSVs 702 may electrically connect the back side of some or all of the stacked wafers in the 3D integrated structure. It should be noted that electrical signals can be distributed throughout the 3D integrated structure using a combination of intra-wafer TSVs, for example the intra-wafer TSVs 104, and inter-wafer TSVs, for example the inter-wafer TSVs 702, in any conceivable configuration.

In the present embodiment, the inter-wafer TSVs 702 may electrically connect the first IC chip 201 to the second IC chip 404. More specifically, the inter-wafer TSVs 702 may electrically connect back side wiring (not shown) in the second IC chip 404 to the back side wiring 604 of the first IC chip 201. In an embodiment, the inter-wafer TSVs 702 may be coupled to the top metal of the front side of the second IC chip. The inter-wafer TSVs 702 may serve to carry power or input/output (IO) signals between multiple wafers in the 3D integrated structure. It should be noted that embodiments are contemplated in which 3D integrated structure may have inter-wafer TSVs that carry only power signals, only IO signals, or a combination of both. In any of the above embodiments, the power or input/output (IO) signals can be carried from the inter-wafer TSVs 702 into the back side wiring 604.

In an embodiment in which one of the inter-wafer TSVs 702 carries a power signal, the back side wiring 604 may be electrically connected to that inter-wafer TSV 702. The power signal may be carried from the inter-wafer TSV 702 and distributed using the backside wiring 604. The power signal may be carried to the front side wiring layers 202 by way of the back side wiring 604 and the intra-wafer TSVs 104. In an embodiment, the inter-wafer TSVs 702 may be connected to a power switch on the front side 106 of the first IC chip 201 as well as additional power switches on additional chips, so that the power signal may be coupled to multiple chips. In an embodiment in which one of the inter-wafer TSVs 702 carries an IO signal, the IO signal may be carried from the inter-wafer TSV 702 to the front side wiring layers 202 by way of the back side wiring 604 and the intra-wafer TSVs 104.

After the inter-wafer TSVs 702 are formed, an additional bonding layer (not shown) may be formed on the back side wiring dielectric layer 608 and the back side wiring 604 in order to bond an additional IC chip (not shown) to the structure 700 using substantially similar techniques as those described above with reference to FIG. 5. The process described above with reference to FIGS. 1-7 may then be repeated to form one ore more additional 3D integrated wafers.

Figure 8:
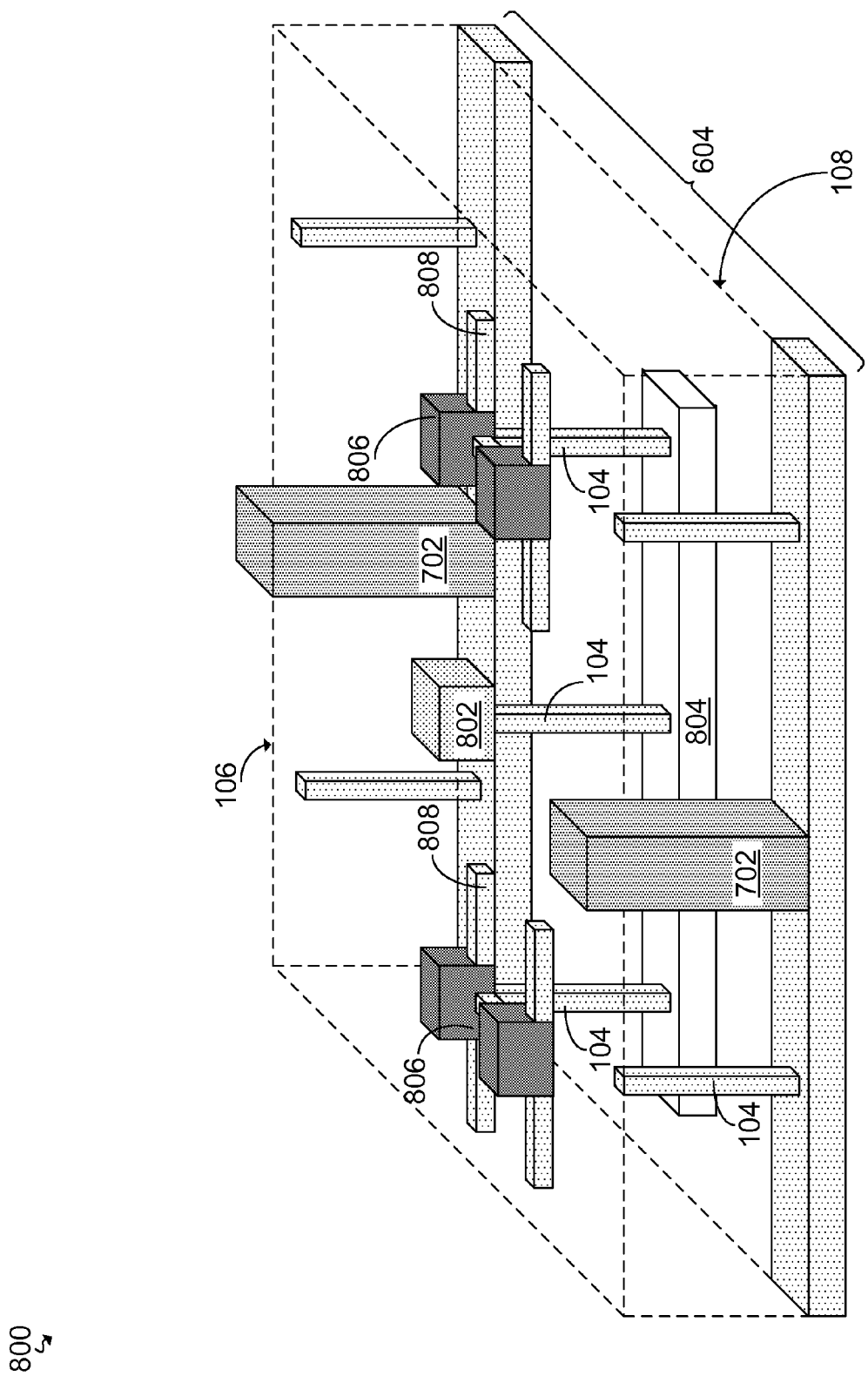
FIG. 8 is an isometric view illustrating double-sided 3D hierarchal memory wordlines using metal levels on both the frontside and backside of wafer, according to an embodiment of the present invention.

Referring now to FIG. 8, an isometric view of a structure 800 is shown according to an embodiment in which the first IC chip 201 (FIG. 7) is a very large-scale integration ("VLSI") chip having hierarchical architecture. FIG. 8 illustrates an isometric view of the first IC device 201 (FIG. 7) having a double-sided hierarchical architecture. The double-sided hierarchical architecture may refer to an arrangement in which local signal lines may be located in the front side wiring layers 202 to support local circuits, transistors, or FEOL structures, and global signal lines may be located in the back side wiring 604. It should be noted that the substrate 102 (FIG. 7) and the front side wiring layers 202 (FIG. 7) are not depicted in FIG. 8 for illustrative purposes so as to more clearly portray the pathway of the double-sided 3D hierarchical architecture.

In the present embodiment, the structure 800 may represent a VLSI chip, preferably a memory chip, having one or more global circuits 802 (i.e. global wordline decoders), one or more global signal lines 804 (i.e. global wordlines), one or more local circuits 806 (i.e. local wordline drivers), and one or more local signal lines 808 (local wordlines coupled to a plurality of memory cells), in addition to the intra-wafer TSVs 104 and the inter-wafer TSVs 702. In general, electrical connections can be made between different features located on the front side 106 using the intra-wafer TSVs 104 and the inter-wafer TSVs 702 in conjunction with the back side wiring 604.

Typically, hierarchical architecture, particularly for a memory chip, would be fabricated in the front side wiring layers 202. In the present embodiment, the one or more global circuits 802, the one or more local circuits 806, and one or more the local signal lines 808 may be fabricated in the front side transistors and wiring layers 202 while the one or more global signal lines 804 may be fabricated in the back side wiring 604. The one or more global circuits 802 may communicate with the one or more global signal lines 804 through the intra-wafer TSVs 104. Therefore, the hierarchical architecture of the memory chip may be segmented in each memory array segment without breaking the memory array, where global circuits and local circuits on the front side 106 are coupled, using the back side wiring 604 with the intra-wafer TSVs 104 serving as the connection between the front side 106 and the back side 108.

More specifically, the double-sided 3D hierarchical architecture may be used for hierarchical decoding architecture for memory. The double-sided 3D hierarchical decoding architecture may be achieved by using the intra-wafer TSVs 104 to connect the output signal of one or more global circuits 802 (which, in an embodiment, may be global decoders) formed on the front side 106 of the semiconductor substrate 102 to one or more global signal lines 804 (which, in an embodiment, may be global decoding signals) in the backside wiring 604. The one or more global decoding signals 804 may run along a length of the back side 108 where it may connect to other intra-wafer TSVs 104. The output signal may then be returned to the front side 106, via different intra-wafer TSVs 104, where it may travel to the one or more local circuits 806 (which, in an embodiment, may be local wordline drivers). The one or more local circuits 806 may then connect to one or more bit cells in a bit cell array (not shown) through the local signal lines 808. Optionally, the local signal lines 808 may be directly coupled to access memory cells without local wordline drivers. In one embodiment, an individual global decoding signal 804 may be located between two individual wires of the back side wiring 604 that are carrying power signals. Power may also be routed to the front side 106 through the inter-wafer TSVs 702, the back side wiring 604, and the intra-wafer TSVs. This arrangement may be described below with reference to FIG. 12.

As part of the back side wiring 604, the one or more global signal lines 804 may have a thickness approximately 8 times to approximately 10 times larger than the thickness of the one or more local signal lines 808 in the front side wiring layers 202. It should be noted that the one or more global circuits 802 and the one or more local circuits 806 are depicted in a simplified form, and the bit cell arrays, as well as the semiconductor substrate 102 and the front side wiring layers 202, are not depicted in FIG. 8 for illustrative purposes so as to more clearly portray the pathway of the double-sided 3D hierarchal wordline architecture.

Advantageously, the amount of wiring in the front side wiring layers 202 may be reduced by relocating some of the wiring to the back side wiring 604. More specifically, the inter-wafer TSV 104 allow for the distribution of global power, IO, and wordline signals to be spread between both the front side wiring layers 202 and the back side wiring 604. In addition, the backside wiring 604 and global signal line 804 may have a lower resistance and longer run-length than typical front side wiring due to its larger dimensions which may reduce the need for control/repeater banks typically found in conventional wordline architecture formed solely on a front side of an IC chip that may thin wiring. Optionally, the local circuits 802 may include a 1/n decoding function (i.e. n=4) such that the global signal wiring pitch 804 is increased as large as n. This results in overcoming the larger pitch requirement for global signal 804 than the multiple local signal lines 808. As such, each global signal line 804 may be capable of driving more bit cell arrays. In addition, the double-sided 3D hierarchal word line architecture allows for multiple local circuits 806 to be supported by one shared global circuit 802, thereby improving memory area efficiency.

Figure 9:
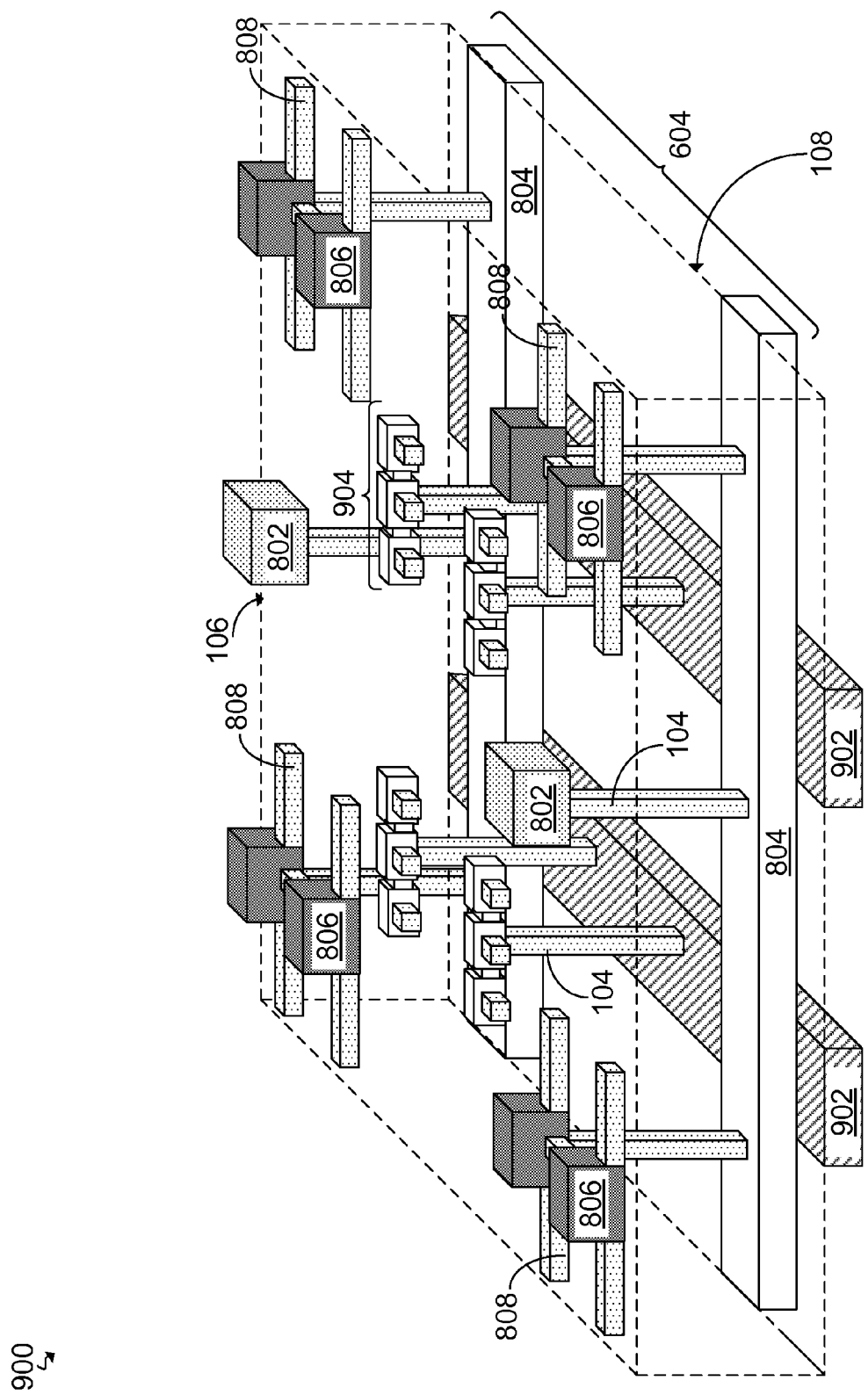
FIG. 9 is an isometric view illustrating double-sided 3D hierarchal wordline architecture as well as primary dataline double-sided 3D hierarchal column architecture, according to an embodiment of the present invention.

Referring now to FIG. 9, and in another embodiment, an isometric view of a structure 900 is shown. FIG. 9 illustrates the incorporation of double-sided 3D dataline architecture in a VLSI chip, and specifically, primary dataline routing in addition to the 3D hierarchal architecture for memory wordline routing. In this embodiment, primary datalines 902 (hereinafter "PDLs") may be formed on the backside 108 as part of the back side wiring 604. The PDLs 902 may be connected to multiple sense amplifiers (SAs) 904 for a memory array (not shown) on the font side 106 through an intra-wafer TSV 104. The PDLs 902 may have a thickness that is approximately 8 times to approximately 10 times larger than the thickness of the local signal lines 808. This arrangement may reduce the amount of wiring required on front side 106 and may reduce the need for control circuit/repeater banks due to the lower resistance of the large diameter PDLs 902, which allows for longer run-lengths compared to conventional thin front-side wires.

Figure 10:
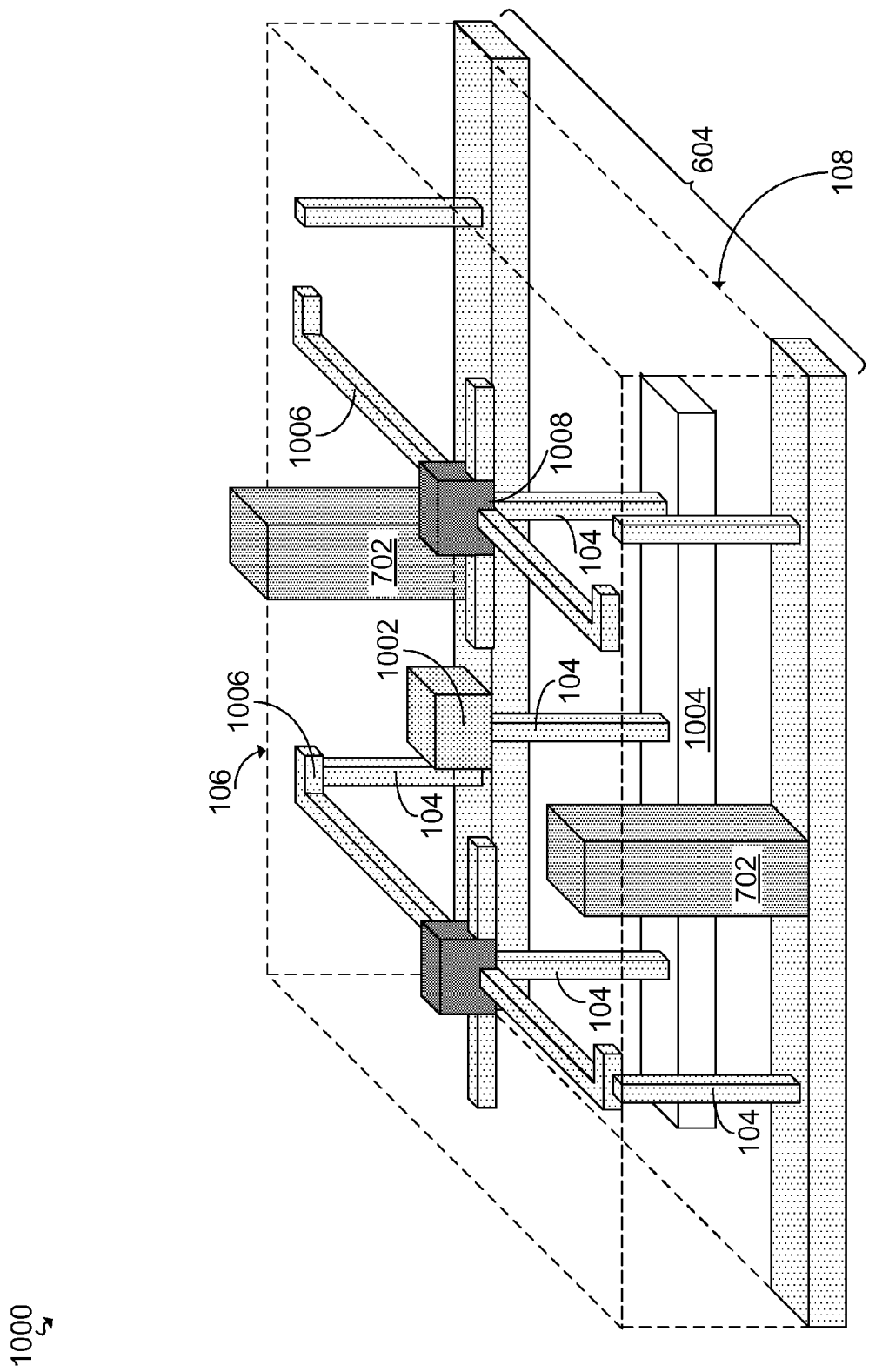
FIG. 10 is an isometric view illustrating double-sided 3D hierarchal wordline architecture as well as double-sided 3D hierarchal logic clocking networking architecture, according to an embodiment of the present invention.

Referring now to FIG. 10, and in another embodiment, an isometric view of a structure 1000 is shown. FIG. 10 illustrates the incorporation of double-sided 3D hierarchal logic clocking networking architecture to the 3D hierarchal architecture for memory wordline routing. In this embodiment, one or more logic buffers 1002 (hereinafter "logic buffers") may be connected to a distribution grid 1004 of back side wiring 604 through the intra-wafer TSVs 104. The distribution grid may then be connected to different intra-wafer TSVs 104, which may then connect to a local logic feature 1008 and thin logic wiring 1006 formed in the wiring layers 202 (FIG. 7) formed on the front side 106. The wiring layers 202 may run for either x or y, or both direction. This arrangement may reduce the amount of wiring required on front side 106 and may reduce the need for control circuit/repeater banks due to the lower resistance of the large diameter distribution grid 1004, which allows for longer run-lengths compared to conventional thin front-side wires. In an embodiment, the local logic device 1008 may be a local logic buffer which may drive a corresponding local logic network. In an embodiment, the double-sided 3D hierarchal logic clocking networking architecture may be a clock tree network. In other words, one global clock buffer 1002 may drive a global clock tree wire 1004 on the back side 108 though the intra-wafer TSV 104. The global clock tree wire 1004 may then connect to the local logic feature 1006, which may be a local clock driver, through an intra-wafer TSV 104. The local logic feature 1006 may drive a corresponding local clock tree (not shown).

Figure 11:
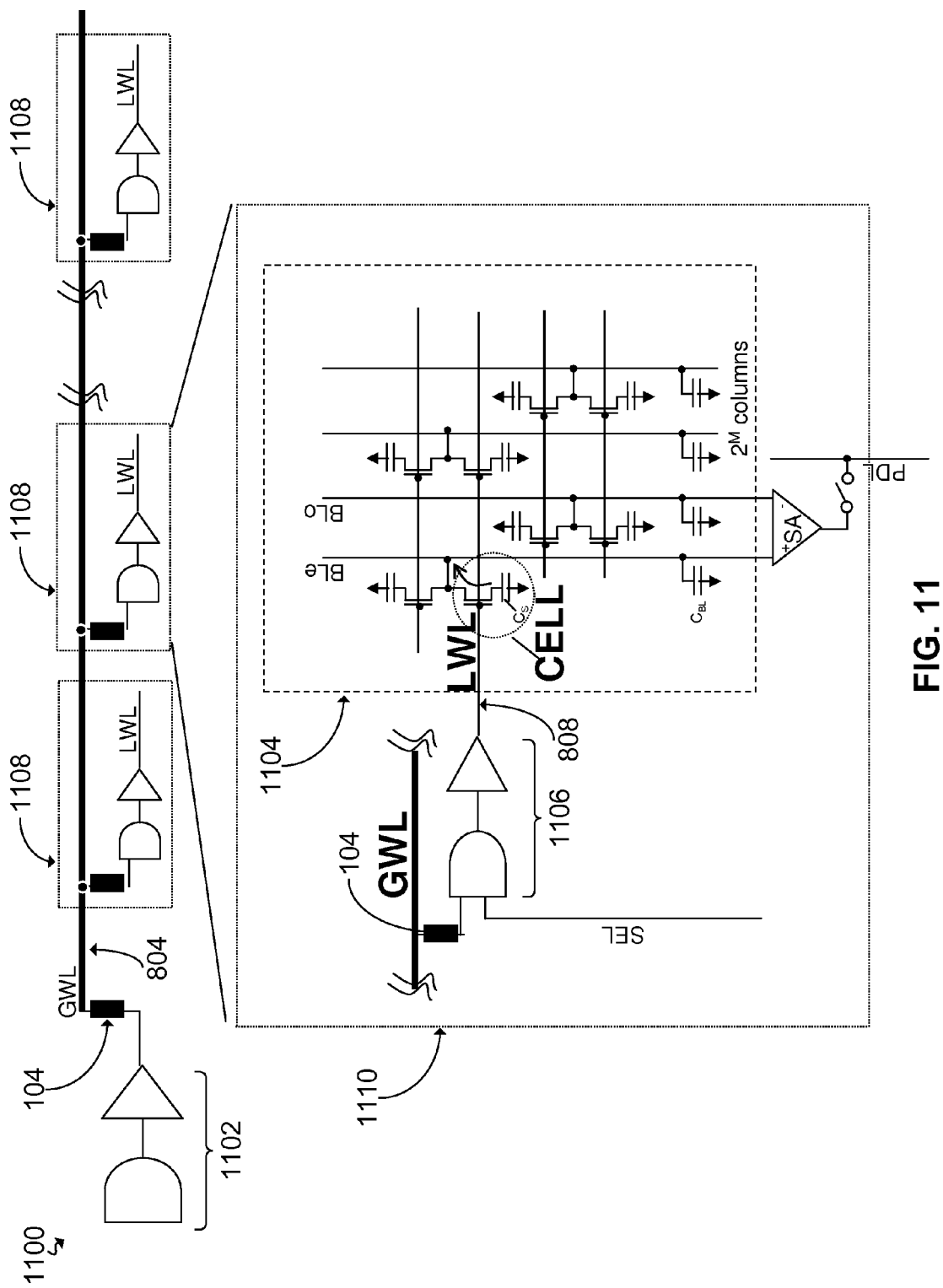
FIG. 11 is schematic illustrating double-sided 3D hierarchical wordline architecture, according to an embodiment of the present invention.

Referring now to FIG. 11, and in another embodiment, a schematic 1100 is shown. FIG. 11 illustrates double-sided 3D hierarchical wordline architecture, where a signal global word line (GWL) 804 is located on the back side 108 (FIG. 7), and all other features are included on the front side 106 (FIG. 7). Unlike conventional hierarchical wordline structure typically used for 2D memory, the signal GWL 804 is formed on the back side 108 (FIG. 7) of the first IC chip 201 (FIG. 7) in the back side wiring 604. More specifically, a global decoder circuit 1102 on the front side 106 (FIG. 7) may be coupled to the signal GWL 804 in the back side wiring 604 (FIG. 7) using an intra-wafer TSV 104. The signal GWL 804 may run on the back side 108 (FIG. 7) under a memory array 1104 and may be coupled to a local wordline driver circuit 1106 on the front side 106 (FIG. 7) using an intra-wafer TSV 104. This arrangement may results in the activation the local wordline 808 on the front side 106 (FIG. 7). Because the signal GWL 804 is formed on the back side 108 (FIG. 7) after the semiconductor substrate 102 (FIG. 7) is thinned, no additional wiring is required for a GWL on the front side 106. In addition, the signal GWL 804 may be made of thick low resistive wire it may be able to support more memory segments 1108 and/or memory tiles 1110 through each global decoder circuit 1102 than in conventional 2D hierarchal decoding architecture.

In this double-sided 3D hierarchical wordline architecture, the signal GWL 804 on the back side 108 (FIG. 7) nay have a wiring pitch that is much greater than the local wordline 808 wiring pitch in the front side 106. This issue may be addressed by including a 1/n (i.e., n=4) decoding function within one of the selection signals (SEL) in the local wordline driver circuit 1106, allowing the signal GWL 804 wiring pitch to be as large as n (i.e., n=4). This may result in one signal GWL 804 coupling to n of local wordline driver circuits 1106 through one intra-wafer TSV 104. Each local wordline driver circuit 1106 may couple to one of the n local wordlines 808, thereby overcoming the wiring pitch problem.

Figure 12:
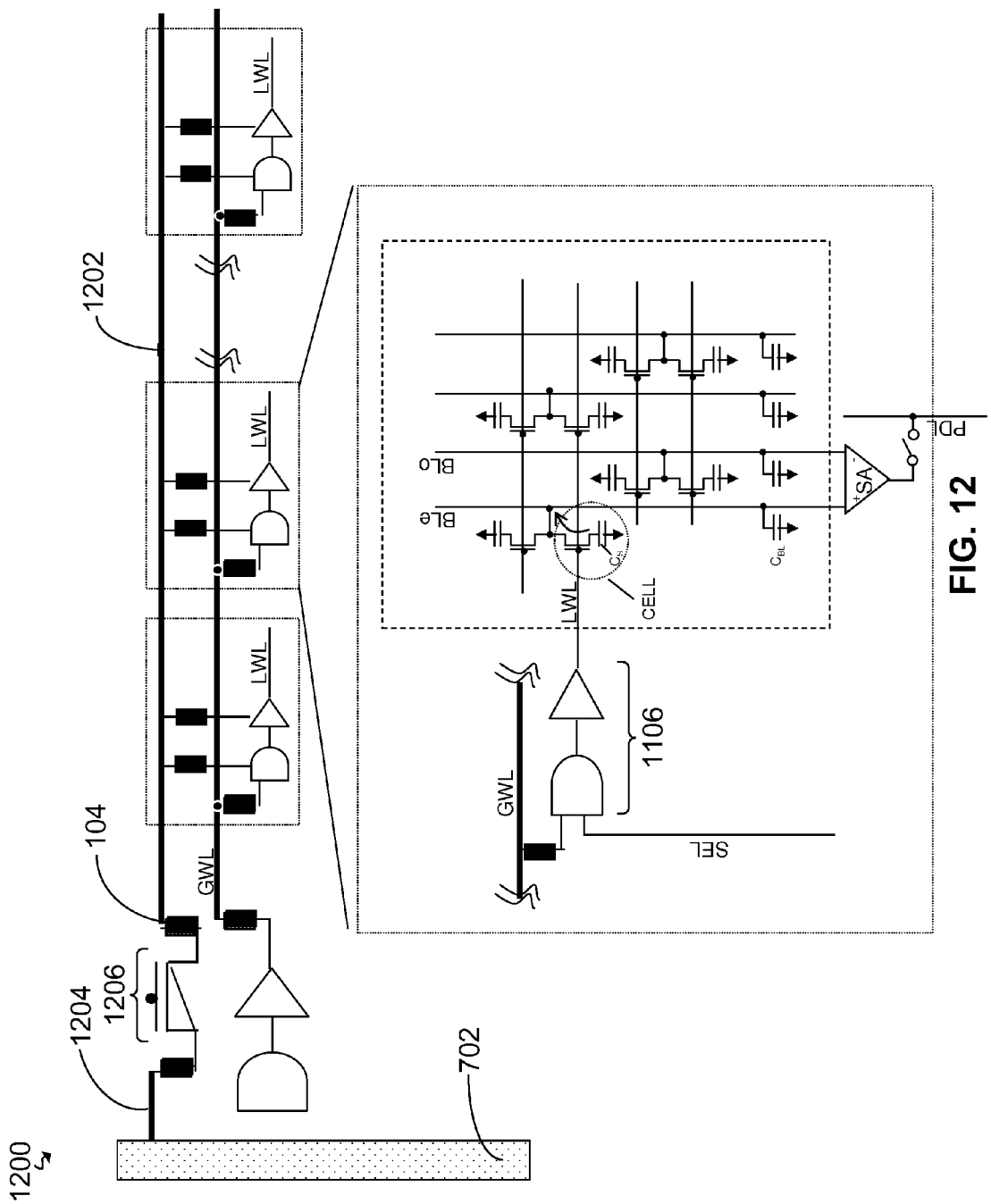
FIG. 12 is a schematic illustrating the integration of intra-wafer TSVs for power supply double-sided 3D integration hierarchical wordline architecture, according to an embodiment of the present invention.

Referring now to FIG. 12, and in another embodiment, a schematic 1200 is shown. FIG. 12 illustrates the integration of intra-wafer TSVs 104 for power supply double-sided 3D hierarchical wordline architecture described above with reference to FIG. 11. In addition to the GWL arrangement describe above with reference to FIG. 11, one or more power bus lines 1202 may be formed on the back side 108 (FIG. 7) in back side wiring 604 (FIG. 7). More specifically, a global power supply, which is common for more than one chip stacked in the 3D package may be supplied to each individual IC chip (e.g., the first IC chip 201 (FIG. 7)) by an inter-wafer TSV 702. The inter-wafer TSV 702 may be coupled to power lines 1204 formed in the back side wiring 604 (FIG. 7). The power lines 1204 may be coupled to a power gate switch 1206 formed on the front side 106 (FIG. 7) through an intra-wafer TSV 104. The output of the power gate switch 1206 may be coupled to the one or more power bus lines 1202 on the back side 108 (FIG. 7) using an intra-wafer TSV 104, serving as an intra-wafer power supply. The one or more power bus lines 1202 may then connect to the local wordline driver circuit 1106 through an intra-wafer TSV 104. In an embodiment, the one or more power bus lines 1202 may be coupled directly to the local wordline driver circuit 1106 through an intra-wafer TSV 104 without first routing through the power gate switch 1206. In an embodiment, the intra-wafer TSVs 104 used for the GWL architecture and the power bus lines 1202 may be preferably arranged in each column segment break in a plurality of memory array segments coupling to the GWL 1202. The inter-wafer TSVs 702 for main power supply may be arranged on the periphery of the memory IP (not shown) or the periphery of a quadrant (not shown) in the memory IP (not shown).

Figure 13:
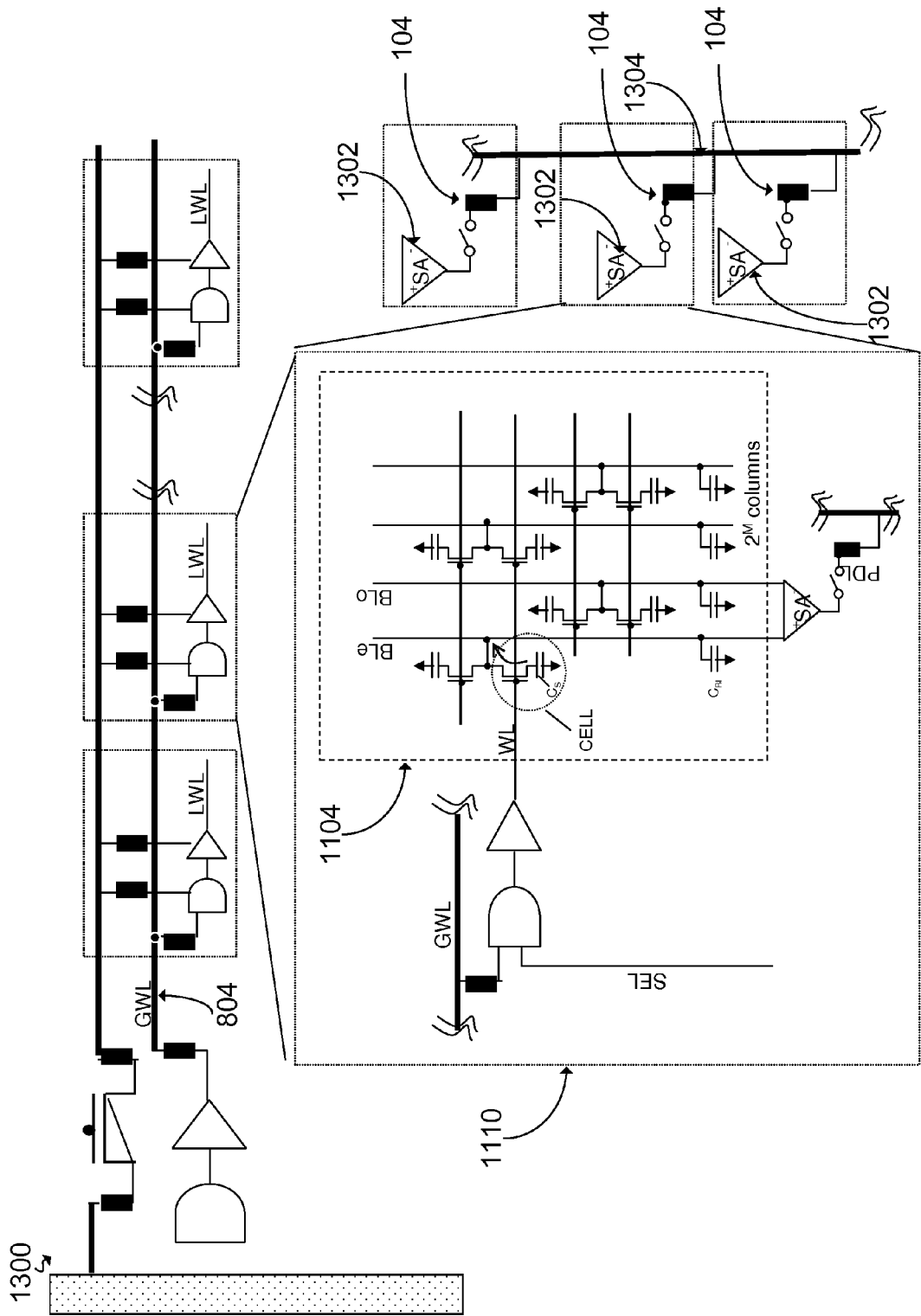
FIG. 13 is a schematic illustrating double-sided 3D hierarchical architecture used for primly dataline (PDL) communication, according to an embodiment of the present invention.

Referring now to FIG. 13, and in another embodiment, a schematic 1300 is shown. FIG. 13 illustrates an embodiment in which the double-sided 3D hierarchical architecture may be used for primly dataline (PDL) communication. As shown in the drawing, the PDL 1304 may run perpendicular to the global wordline signal lines (GWLs) 804 and may communicate data bits between the peripheral circuit (not shown) and the memory tiles 1110, which may be stacked in a vertical direction. More specifically, in this embodiment, a sense amplifier circuit 1302 from each row segment of the memory tile 1104 may be coupled to a PDL 1304 formed on the back side 108 (FIG. 7) using an intra-wafer TSV 104. For simplicity, the drawing shows one sense amplifier circuit 1302 in each memory tile 1110 coupled to one PDL 1304, however multiple sense amplifier circuits 1302 may be coupled to the PDL 1304. This embodiment may allow for more memory tiles 1110 to be supported per peripheral circuit (not shown) than in conventional 2D hierarchal architecture because of the use thick PDL 1304 having a low resistance, thereby increasing the memory area efficiency.

Figure 14:
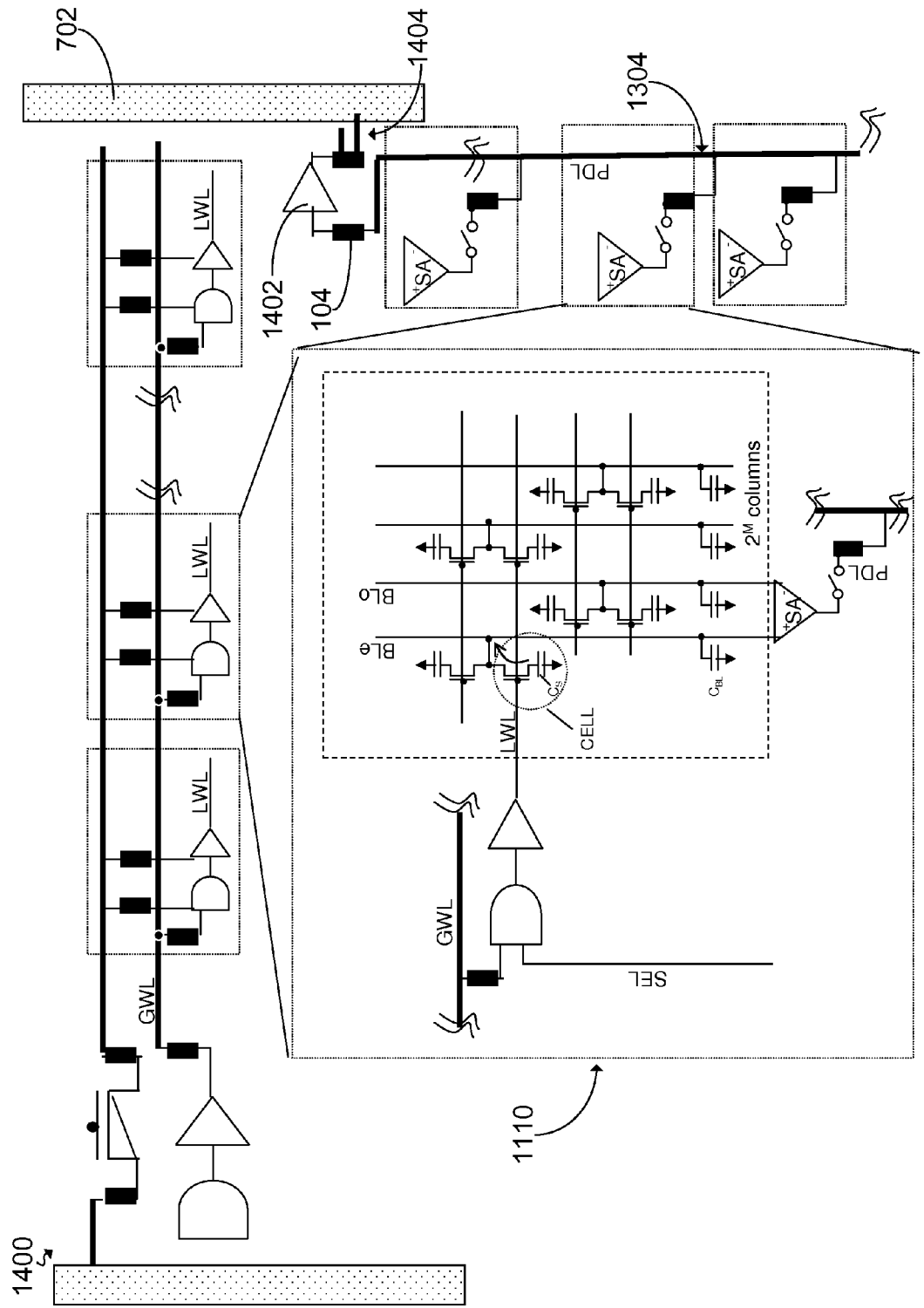
FIG. 14 is a schematic illustrating double-sided hierarchical architecture for PDL communication extended between two or more IC chips, according to an embodiment of the present invention.

Referring now to FIG. 14, and in another embodiment, a schematic 1400 is shown. FIG. 14 illustrates an embodiment in which the double-sided hierarchical architecture for PDL communication may be extended between two or more IC chips fabricated in different wafers. In this embodiment, a PDL driver 1402 on the front side 106 (FIG. 7) may be coupled to an inter-wafer TSV 702. In an embodiment, a PDL 1304 may be coupled to an input of the PDL driver 1402 using intra-wafer TSV 104. The output of the PDL driver 1402 may then be routed again to the back side 108 (FIG. 7) through an intra-wafer TSV 104 and then to a short back side wire 1404 where it may then connect to the intra-wafer TSV 702. In an embodiment, the PDL driver 1402 and the coupled intra-wafer TSVs 104 and inter-wafer TSV 702 may be arranged in a peripheral circuit area (not shown) or re-driver block (not shown) of a memory IP (not shown). In an embodiment in which the PDL driver 1402 is arranged in a re-driver block (not shown), it may be arranged between two blocks (not shown), each block (not shown) composed of a stack of memory tiles 1110.

Figure 15:
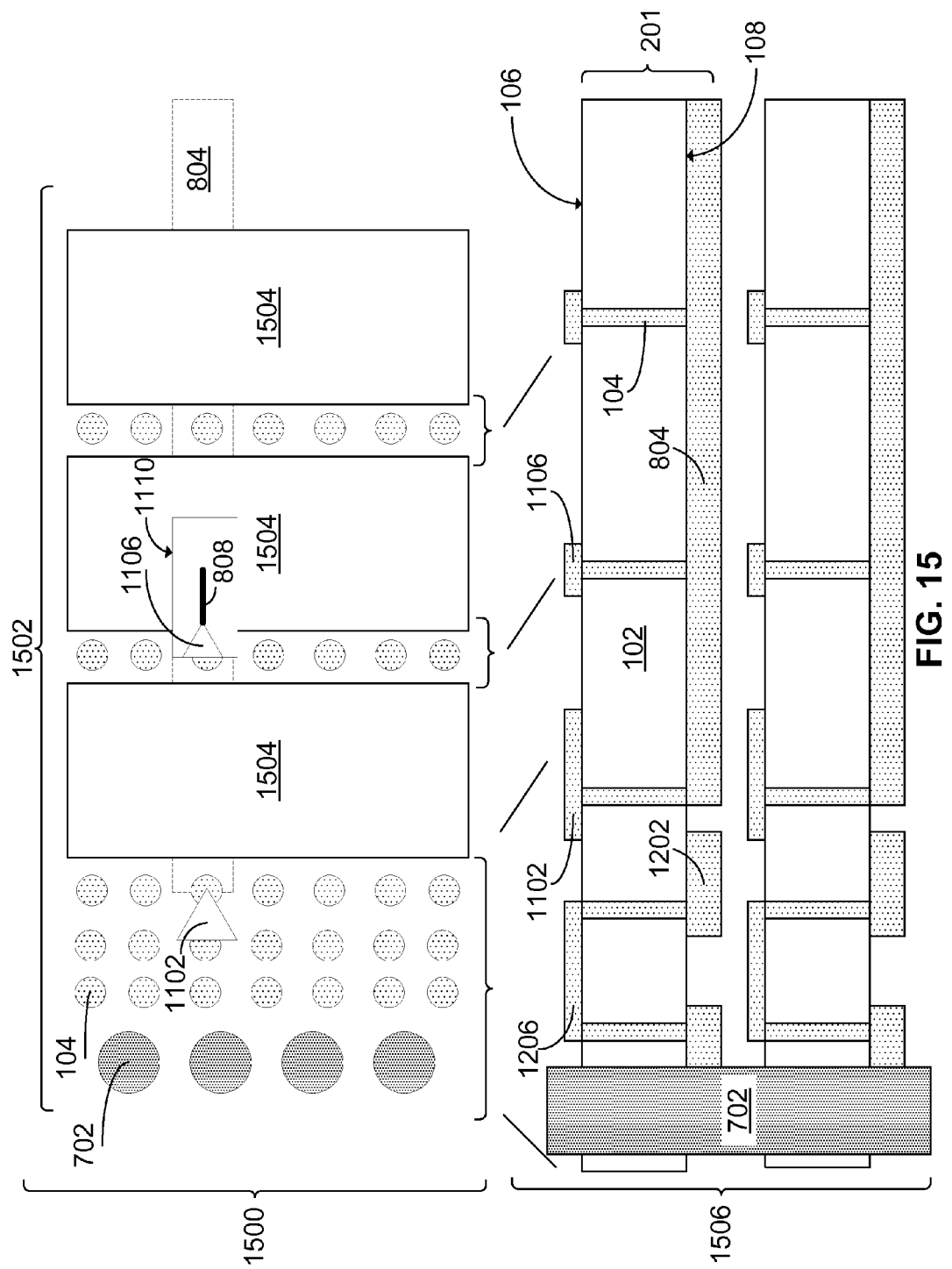
FIG. 15 is a top view and cross sectional view illustrating an arrangement of the intra-wafer TSVs, inter-wafer TSVs, and back side wiring according to an embodiment of the present invention.

Referring now to FIG. 15, the embodiments discussed above with reference to FIGS. 11-12 may be further explained with a top view 1500 and a cross-sectional view 1506 of the first IC chip 201 (FIG. 7). FIG. 15 illustrates a preferred arrangement of the intra-wafer TSVs 104 and inter-wafer TSVs 702 according to an embodiment of the present invention, where wordline runs horizontal direction. The inter-wafer TSVs 702 may be formed on a left periphery of a memory quadrant 1502, which may be part of a larger memory IP. The memory quadrant 1502 may be formed on the front side 106 of the first IC chip 201. The memory quadrant 1502 may contain plurality of memory segments 1504, each consisting of plurality of memory tiles 1110 (FIG. 11. Intra-wafer TSVs 104 may be formed between the inter-wafer TSVs 702 and the memory segment 1504 as well as between the individual memory segments 1504. In an embodiment, a global decoder circuit 1102 (located in the left side of the quadrant 1502 on the front side 106) and a local wordline driver circuit 1106 (located between memory segments 1504 on the front side 106), may be coupled using a combination of the intra-wafer TSVs 104 and signal GWL 804.

In an embodiment, the double-sided 3D hierarchical wordline architecture may also include the main power supply which may be distributed using the inter-wafer TSV 702. The inter-wafer TSVs 702 may be coupled to a power gate switch 1206 on the front side 106 through an intra-wafer TSVs 104. The power gate switch 1206 may then be coupled to the power bus lines 1202 through another intra-wafer TSVs 104. The power bus lines 1202 may run on the back side 108 under the plurality of the memory tiles 1504 and distribute power to the local wordline driver circuits 1106 through intra-wafer TSVs 104 located between the memory tiles 1504. In another embodiment, power may be distributed from the inter-wafer TSVs 702 directly to the power bus lines 1202 without using a power gate switch 1206. In typical 2D wordline architecture, approximately 20% of the front side wiring may be reserved only for power distribution, which is typically distributed in higher wiring layers. By moving the power grid to the back side, embodiments of the present invention may free up the front side wiring typically used for power for use in additional signal wiring or additional devices, while supporting more column segments per global wordline driver. This may results in an improvement in memory area efficiency.

Figure 16:
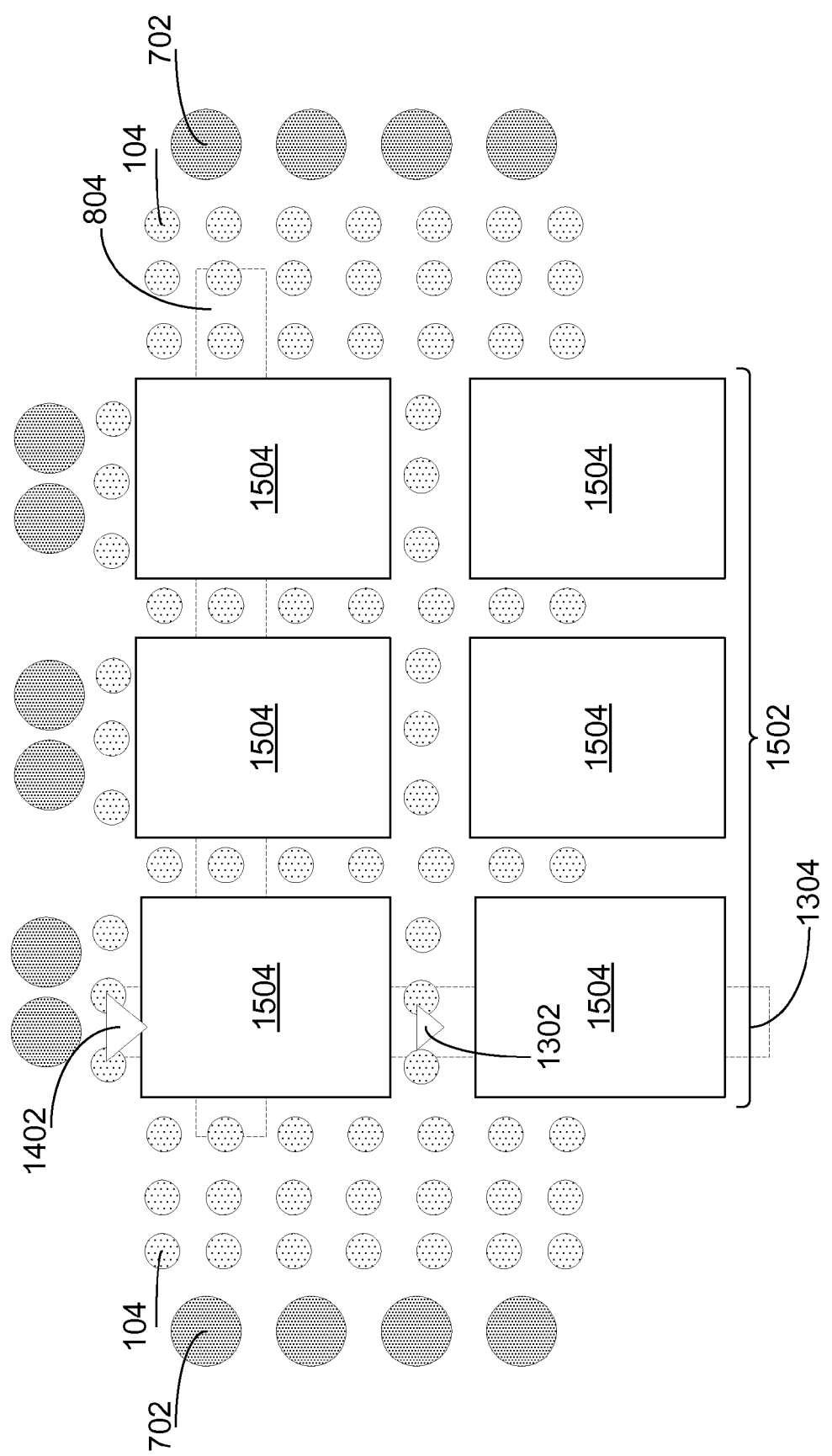
FIG. 16 is a top view illustrating an arrangement of the intra-wafer TSVs, inter-wafer TSVs, and back side wiring according to an embodiment of the present invention.

Referring now to FIG. 16, the embodiments discussed above with reference to FIGS. 13-14 may be further explained with a top view 1600 of the first IC chip 201 (FIG. 7). In these embodiments, the PDLs 1304 may perpendicular to global signal lines 804 on the back side 108 (FIG. 7) under a plurality of the memory segments 1504 (which may be contain a stack of memory tiles 1110 (FIG. 15). The inter-wafer TSVs 104 may be arranged between rows of the memory segments 1504 and may be used to connect the sense amplifier circuits 1302 on the front side 106 (FIG. 7) to the PDLs 1304 on the back side 108 (FIG. 7). In addition, the inter-wafer TSVs 104 arranged on the periphery of the memory quadrant 1502 may be used to couple the PDL driver 1402 on the front side 106 (FIG. 7) to the PDLs 1304.

Embodiments of the present invention utilize sub-micro intra-wafer TSVs 104 for intra wafer connections and intra-wafer power distribution and large, low-density, inter-wafer TSVs 702 for inter-strata/wafer connections for signal and/or power distribution. Power and/or IO signals may be carried through multiple IC chips in a stack and distributed to each IC chip through the backside wiring 604 and the intra-wafer TSVs 104 to the front side 106, where it may be distributed to FEOL structures (not shown) and frontside wiring layers 202.

Because of the large width of the inter-wafer TSVs 702 and their location on the periphery of the chips, and the dense connections formed with the intra-wafer TSVs 104, embodiments of the present invention may reduce the area penalty on the frontside 106 of the first IC chip 201 as compared to conventional 3D designs which may use only one size of TSVs (typically larger than the intra-wafer TSVs 104) to form a 3D connection. This architecture, in turn, may reduce the amount of stress put on the semiconductor substrate 102. In addition, this architecture may minimize problems associated with bonding misalignment during the formation of a 3D integrated structure because only the inter-wafer TSVs 702 are subject to this misalignment. The intra-wafer TSVs 104 may only subject to lithographic tolerances of the order of approximately 10 nm to approximately 100 nm, depending on the process used during formation.

Embodiments of the double-sided 3D architecture for wordline and/or primary dataline routing using intra-TSVs and inter-TSVs may reduce the amount of wiring layers 202 required on the device side of an IC chip by allowing back side wiring 604 to be used for distributing global signals and global power. Because the back side wiring 604 may have a large thickness, it may be less resistive compared to the thin wiring layers 202. This may allow longer run lengths of the back side wiring 604, thereby reducing the number of repeaters/re-buffers required to distribute global signals. In addition, because the larger back side wiring 604 is used only to carry global signals, and is removed from the smaller front side wiring layers 202, the back side wiring 604 can be optimized solely for a lower voltage drop (IR-drop) instead of having to balance between low RC (required for smaller signal delay) and low IR drop (required for less loss across the power grid) when this grid is formed on the front side.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method, comprising:
   forming one or more intra-wafer through substrate vias (TSVs) extending from a front side of a substrate of a first integrated circuit (IC) chip to a back side of the substrate of the first IC chip;
   forming a local architecture in a front side wiring layer of the first IC chip, the local architecture having one or more local features electrically connected to the one or more intra-wafer TSVs;
   forming a global architecture in a back side wiring layer of the first IC chip, the global architecture connecting to the one or more intra-wafer TSVs and electrically coupling the one or more local features together;
   bonding the first IC chip to a second IC chip, the second IC chip comprising a front side wiring layer and a back side wiring layer; and
   forming one or more inter-wafer TSVs after bonding the first IC chip to the second IC chip, the one or more inter-wafer TSVs extending through an entire thickness of a periphery of the first IC chip and an entire thickness of a periphery of the second IC chip, the one or more inter-wafer TSVs electrically connecting the back side wiring layer of the second IC chip to the back side wiring layer of the first IC chip, the one or more inter-wafer TSVs having a width that is approximately n times larger than a width of the one or more intra-wafer TSVs, with the value of n being selected to reduce the number of repeaters required for distributing global signals, and n varying between approximately 8 and approximately 10.

2. The method of claim 1, wherein forming the local architecture in the front side wiring layer of the first IC chip comprises:
   forming a power gate switch.

3. The method of claim 1, wherein forming the global architecture in the back side wiring layer of the first IC chip comprises:
   connecting, electrically, the one or more inter-wafer TSVs to an external power source;
   forming a power line connected to the one or more inter-wafer TSVs; and
   forming a power bus line.

4. The method of claim 1, wherein forming the local architecture in the front side wiring layer of the first IC chip comprises:
   forming a PDL driver.

5. The method of claim 1, wherein forming the global architecture in the back side wiring layer of the first IC chip comprises:

forming a PDL; and
forming a short back side wire connected to the one or more inter-wafer TSVs, the one or more inter-wafer TSVs electrically connected to an adjacent IC chip.

6. The method of claim 1, wherein the local architecture includes a decoder that enables the one or more local features to connect to an individual wire in the global architecture using an individual intra-wafer TSV.

7. The method of claim 1, wherein forming the global architecture in the back side wiring layer of the first IC chip comprises:
forming a power line bus connected directly to the one or more inter-wafer TSVs.

8. The method of claim 1, wherein forming the global architecture in the back side wiring layer of the first IC chip comprises:
forming a PDL; and
forming a short back side wire connected to the one or more inter-wafer TSVs, the one or more inter-wafer TSVs electrically connected to a vertical stack of memory tiles on the front side.

9. A method, comprising:
forming one or more intra-wafer through substrate vias (TSVs) extending from a front side of a substrate of a first integrated circuit (IC) chip to a back side of the substrate of the first IC chip;
forming a local architecture in a front side wiring layer located on the front side of the substrate of the first IC chip, the local architecture having one or more local features electrically connected to the one or more intra-wafer TSVs;
bonding a second IC chip to the front side wiring layer of the first IC chip, the second IC chip comprising a front side wiring layer and a back side wiring layer;
forming a global architecture in a back side wiring layer located on the back side of the substrate of the first IC chip, the global architecture connecting to the one or more intra-wafer TSVs and electrically coupling the one or more local features together;
etching one or more recesses continuously through an entire thickness of both the first IC chip and the second IC chip, the one or more recesses being located along a periphery of both the first IC chip and the second IC chip; and
filling the one or more recesses with a conductive material to form one or more inter-wafer TSVs, the one or more inter-wafer TSVs electrically connecting the back side wiring layer of the second IC chip to the back side wiring layer of the first IC chip, the one or more inter-wafer TSVs having a width that is approximately n times larger than a width of the one or more intra-wafer TSVs.

10. A method, comprising:
forming one or more intra-wafer through substrate vias (TSVs) extending from a front side of a substrate of a first integrated circuit (IC) chip to a back side of the substrate of the first IC chip;
forming a local architecture in a front side wiring layer of the first IC chip, the local architecture having one or more local features electrically connected to the one or more intra-wafer TSVs;
bonding the first IC chip to a second IC chip, the second IC chip comprising a front side wiring layer and a back side wiring layer;
etching the back side of the substrate of the first IC chip to expose the one or more intra-wafer TSVs such that a conductive path exist through an entire thickness of the substrate of the first IC chip;
forming a global architecture in a back side wiring layer of the first IC chip, the global architecture connecting to the one or more intra-wafer TSVs and electrically coupling the one or more local features together;
etching one or more recesses continuously through an entire thickness of the first IC chip and through an entire thickness of the second IC chip, the one or more recesses being located along a periphery of both the first IC chip and the second IC chip; and
filling the one or more recesses with a conductive material to form one or more inter-wafer TSVs, the one or more inter-wafer TSVs electrically connecting the back side wiring layer of the second IC chip to the back side wiring layer of the first IC chip, the one or more inter-wafer TSVs having a width that is approximately n times larger than a width of the one or more intra-wafer TSVs, the value of n varying between approximately 8 and approximately 10.

* * * * *